(12) United States Patent
Seto

(10) Patent No.: US 12,550,254 B2
(45) Date of Patent: Feb. 10, 2026

(54) WIRING SUBSTRATE

(71) Applicant: KIOXIA CORPORATION, Tokyo (JP)

(72) Inventor: Motoshi Seto, Nishitama (JP)

(73) Assignee: KIOXIA CORPORATION, Tokyo (JP)

(*) Notice: Subject to any disclaimer, the term of this patent is extended or adjusted under 35 U.S.C. 154(b) by 197 days.

(21) Appl. No.: 18/422,072

(22) Filed: Jan. 25, 2024

(65) Prior Publication Data

US 2024/0260178 A1 Aug. 1, 2024

(30) Foreign Application Priority Data

Jan. 31, 2023 (JP) ................................ 2023-013511

(51) Int. Cl.
| | | |
|---|---|---|
| H05K 1/02 | (2006.01) | |
| H05K 1/11 | (2006.01) | |
| H05K 3/34 | (2006.01) | |
| H05K 3/46 | (2006.01) | |

(52) U.S. Cl.
CPC .......... H05K 1/0298 (2013.01); H05K 1/115 (2013.01); H05K 3/3452 (2013.01); H05K 3/4605 (2013.01)

(58) Field of Classification Search
CPC .... H05K 1/0298; H05K 1/115; H05K 3/3452; H05K 3/4015; H05K 3/28
See application file for complete search history.

(56) References Cited

U.S. PATENT DOCUMENTS

| | | | | |
|---|---|---|---|---|
| 6,323,439 B1* | 11/2001 | Kambe | ................. | H05K 3/429 |
| | | | | 174/262 |
| 6,333,857 B1* | 12/2001 | Kanbe | ............... | H01L 23/49894 |
| | | | | 257/E23.079 |
| 7,800,216 B2 | 9/2010 | Inagaki et al. | | |
| 2008/0190657 A1* | 8/2008 | Kanetaka | ............. | H05K 3/3447 |
| | | | | 174/263 |
| 2011/0100700 A1* | 5/2011 | Kariya | .............. | H01L 23/49811 |
| | | | | 174/267 |
| 2017/0170104 A1* | 6/2017 | Shimizu | ............ | H01L 23/49822 |

FOREIGN PATENT DOCUMENTS

| | | |
|---|---|---|
| JP | 2002-43723 A | 2/2002 |
| JP | 2004-311527 A | 11/2004 |
| JP | 5158179 B2 | 3/2013 |

* cited by examiner

Primary Examiner — Sherman Ng
(74) Attorney, Agent, or Firm — Oblon, McClelland, Maier & Neustadt, L.L.P.

(57) ABSTRACT

A wiring substrate according to one embodiment includes a plurality of wiring layers and a plurality of insulating layers alternately stacked in a stacking direction. The plurality of wiring layers include a first wiring layer closest to a surface on one side in the stacking direction of the wiring substrate and a second wiring layer second closest to the surface. A distance from the surface to the first wiring layer is larger than a distance from the first wiring layer to the second wiring layer.

14 Claims, 23 Drawing Sheets

WIRING SUBSTRATE

CROSS-REFERENCE TO RELATED APPLICATIONS

This application is based upon and claims the benefit of Japanese Patent Application No. 2023-013511, filed on Jan. 31, 2023, the entire contents of which are incorporated herein by reference.

BACKGROUND

Field

Embodiments described herein relate generally to a wiring substrate.

Description of the Related Art

There has been known a wiring substrate that includes a plurality of wiring layers and a plurality of insulating layers alternately stacked in a stacking direction. This wiring substrate is used for various kinds of applications.

DETAILED DESCRIPTION

A wiring substrate according to one embodiment comprises a plurality of wiring layers and a plurality of insulating layers alternately stacked in a stacking direction. The plurality of wiring layers include a first wiring layer closest to a surface on one side in the stacking direction of the wiring substrate and a second wiring layer second closest to the surface on the one side. A distance from the surface on the one side to the first wiring layer in the stacking direction is larger than a distance from the first wiring layer to the second wiring layer in the stacking direction.

The wiring substrate according to the embodiment is used for various kinds of applications. In the following example, an example of the wiring substrate according to the embodiment used for a test board is described. The test board is used for a test of a semiconductor device.

[Semiconductor Device 10]

Figure 1:
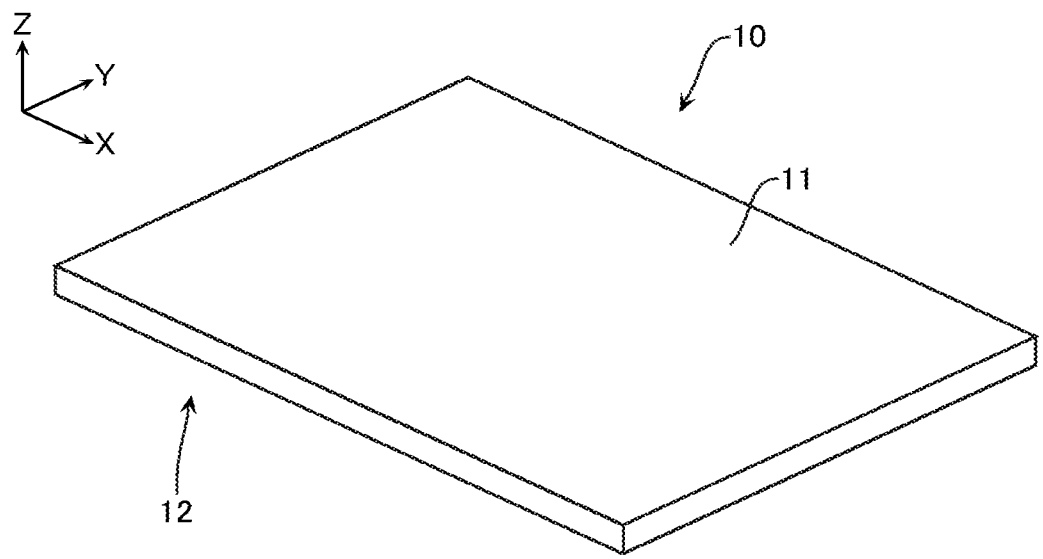
FIG. 1 is a schematic perspective view illustrating a configuration of a semiconductor device 10.
Figure 2:
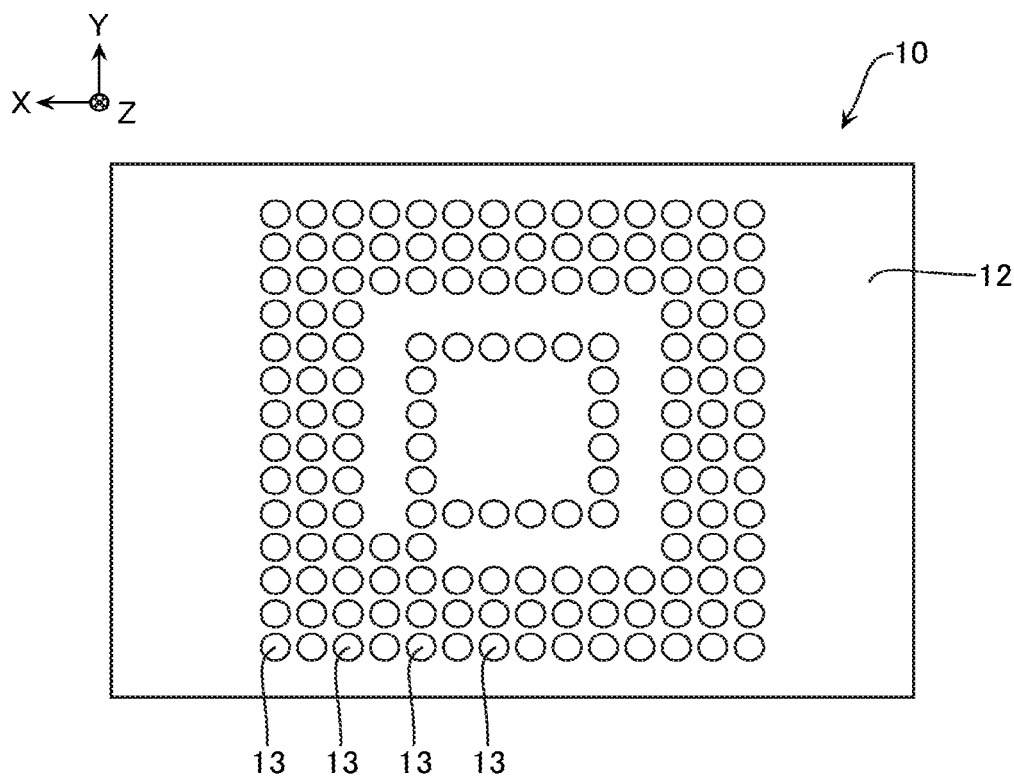
FIG. 2 is a schematic bottom view illustrating a back surface 12 of the semiconductor device 10.

Next, a semiconductor device 10 tested by the test board according to the embodiment is exemplified. FIG. 1 is a schematic perspective view illustrating a configuration of the semiconductor device 10. FIG. 2 is a schematic bottom view illustrating a back surface 12 of the semiconductor device 10.

The semiconductor device 10, for example, may be an embedded Multimedia Card (eMMC) or a Universal Flash Storage (UFS). Note that while FIG. 1 and FIG. 2 exemplify an eMMC or a UFS, the "semiconductor device" in this specification is not limited to an eMMC or a UFS.

FIG. 1 exemplifies a front surface 11 of the semiconductor device 10. FIG. 2 exemplifies the back surface 12 of the semiconductor device 10. A plurality of terminals 13 are disposed on the back surface 12 of the semiconductor device 10. The plurality of terminals 13 are arranged in an X-direction and a Y-direction at a pitch of around 0.5 mm. A part of these plurality of terminals 13 functions as terminals for voltage application that applies a power supply voltage $V_{CC}$ to a circuit inside the semiconductor device 10. A part of these plurality of terminals 13 functions as terminals for voltage application that applies a ground voltage $V_{SS}$ to the circuit inside the semiconductor device 10. A part of these plurality of terminals 13 functions as terminals for signal supply that supplies a data signal to the circuit inside the semiconductor device 10. A part of these plurality of terminals 13 functions as terminals for signal supply that supplies a control signal to the circuit inside the semiconductor device 10. Any function is not assigned for a part of these plurality of terminals 13.

[Test Board 100 According to First Embodiment]

Figure 3:
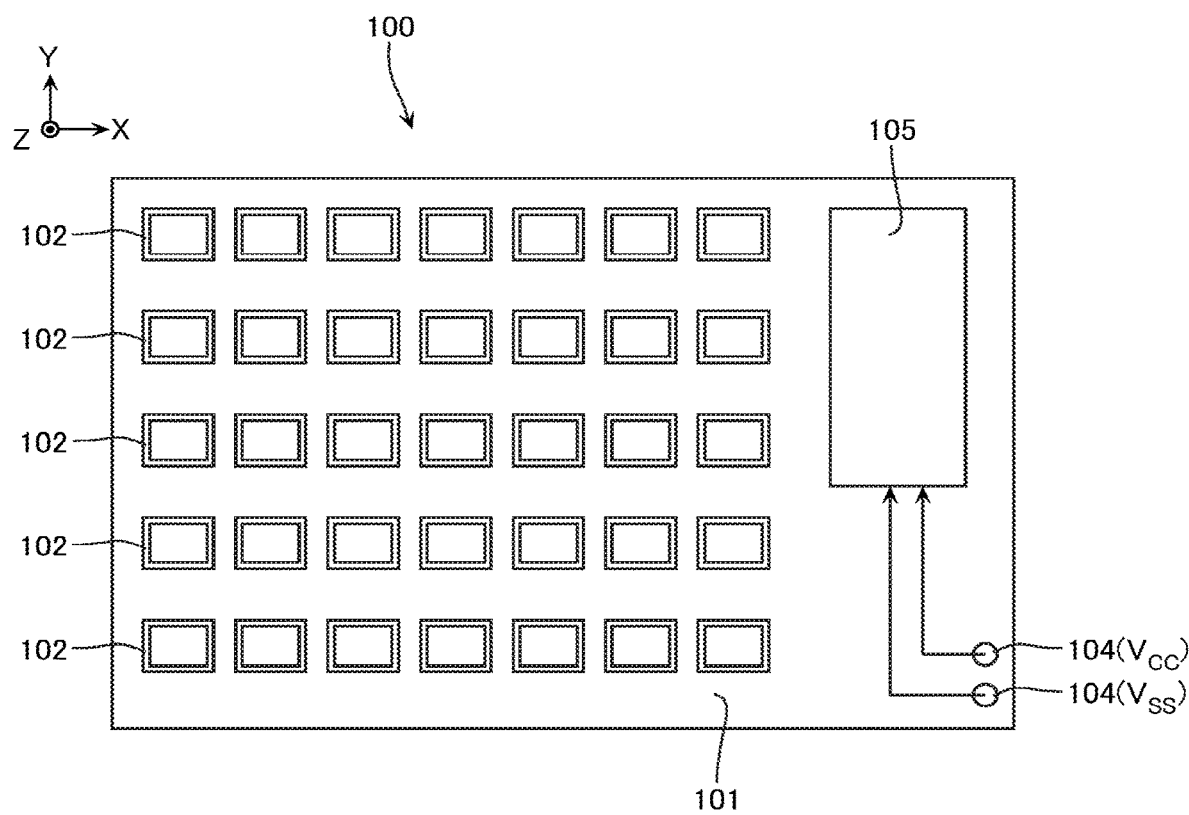
FIG. 3 is a schematic plan view illustrating a configuration of a test board 100.
Figure 4:
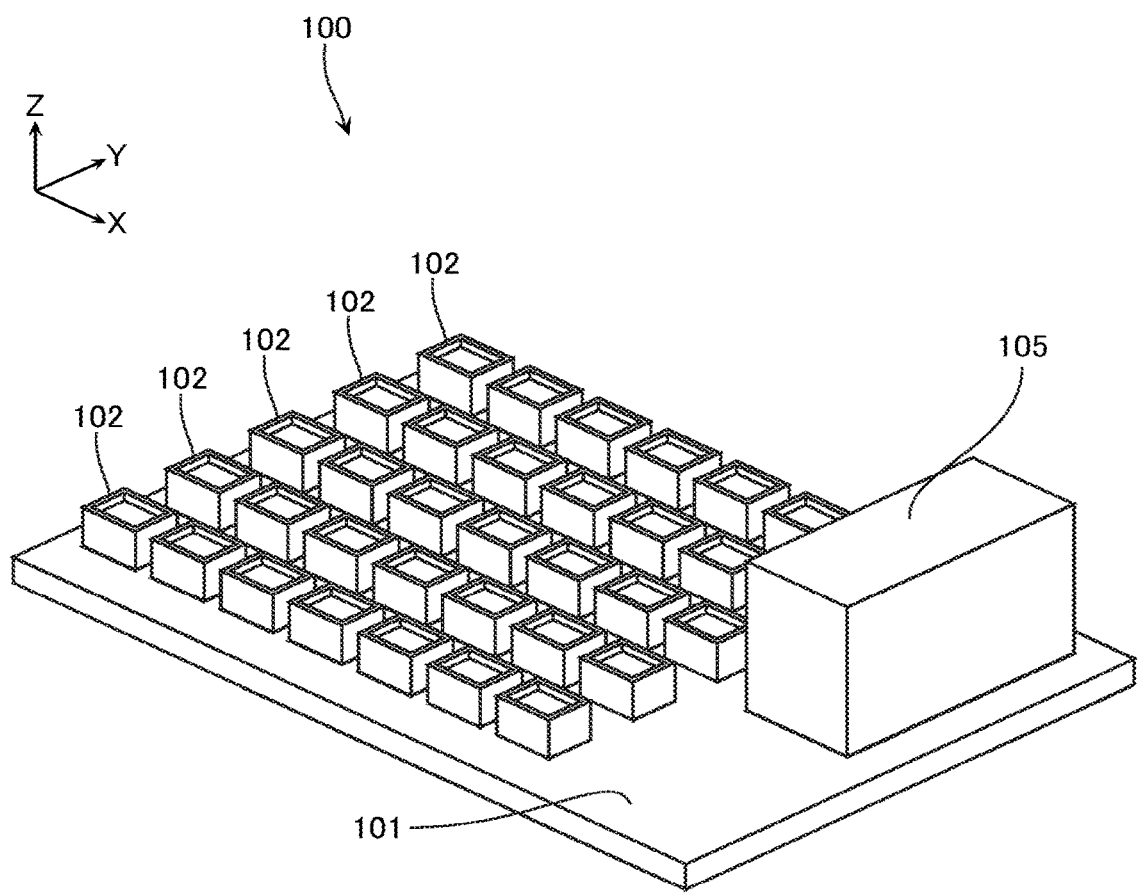
FIG. 4 is a schematic perspective view illustrating the configuration of the test board 100.
Figure 5:
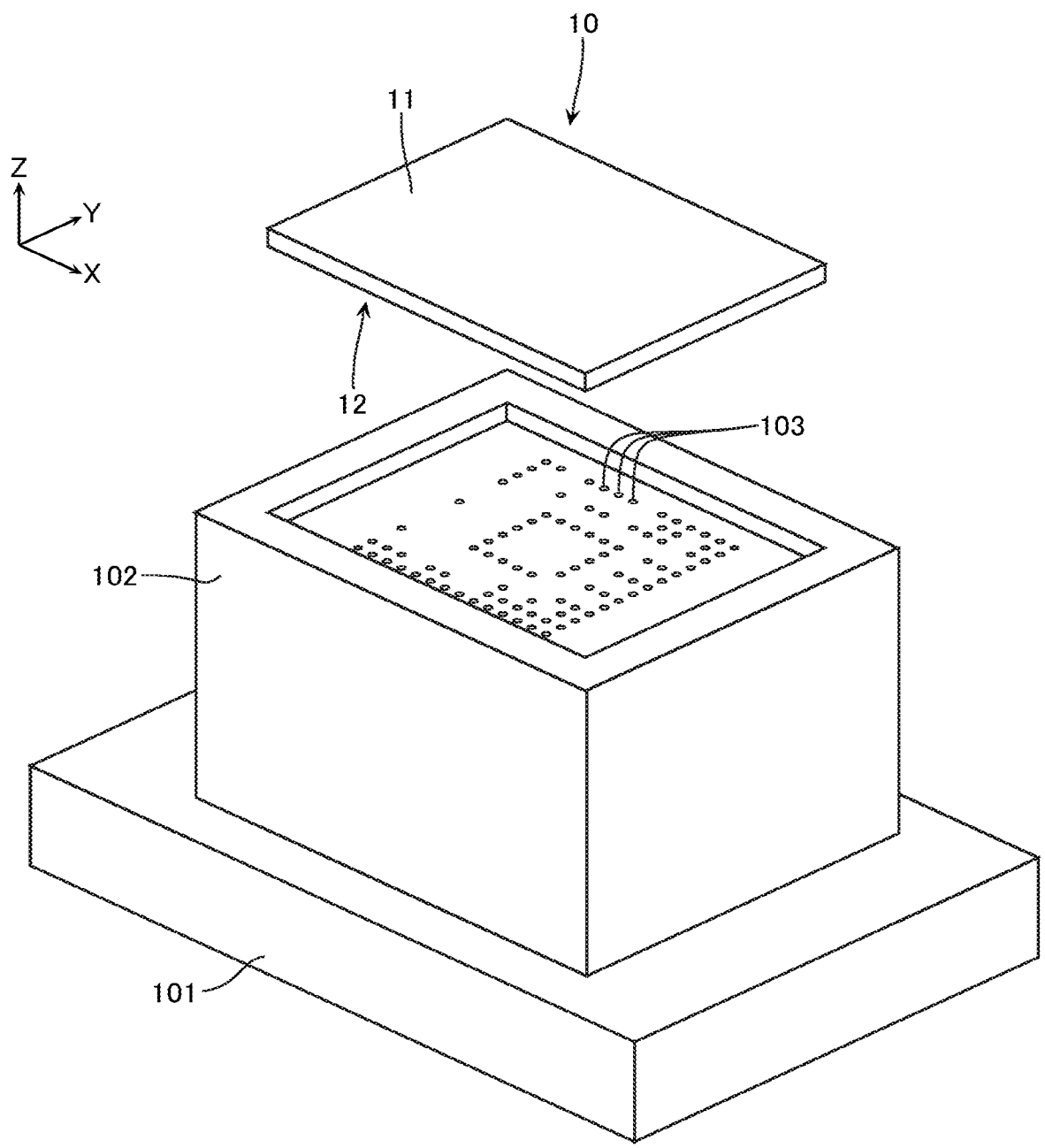
FIG. 5 is a schematic perspective view illustrating a configuration of a part of the test board 100.

FIG. 3 is a schematic plan view illustrating a configuration of the test board 100 according to the first embodiment. FIG. 4 is a schematic perspective view illustrating the configuration of the test board 100. FIG. 5 is a schematic perspective view illustrating a configuration of a part of the test board 100 and enlarges and illustrates a part of FIG. 4.

As illustrated in FIG. 3 and FIG. 4, the test board 100 includes a wiring substrate 101 and a plurality of sockets 102 mounted on the wiring substrate 101. As illustrated in FIG. 5, the test board 100 includes a plurality of connector pins 103 disposed on the socket 102. As illustrated in FIG. 3, the test board 100 includes two external terminals 104 that are able to apply a power supply voltage $V_{CC}$ or a ground voltage $V_{SS}$ to these plurality of connector pins 103 and a jumper block 105 disposed on a current path between the plurality of connector pins 103 and the external terminals 104.

The socket 102 is configured to be able to mount the semiconductor device 10 described with reference to FIG. 1 and FIG. 2. In using the test board 100, for example, as illustrated in FIG. 5, the semiconductor device 10 is mounted on the socket 102 such that the back surface 12 of the semiconductor device 10 becomes a socket 102 side.

The respective connector pins 103 (FIG. 5) are electrically connected to a plurality of wirings disposed on the wiring substrate 101. For example, as exemplified in FIG. 5, the connector pins 103 are disposed on the socket 102 in a pattern corresponding to at least a part of the plurality of terminals 13 (FIG. 2) disposed on the back surface 12 of the semiconductor device 10. Accordingly, for example, as illustrated in FIG. 5, when the semiconductor device 10 is mounted on the socket 102, at least a part of the respective plurality of terminals 13 (FIG. 2) disposed on the back surface 12 of the semiconductor device 10 contact the plurality of connector pins 103 disposed on the socket 102.

The respective external terminals 104 (FIG. 3) are configured to be electrically connectable to the connector pins 103 (FIG. 5) via the wirings and the jumper block 105 disposed on the wiring substrate 101. In the illustrated example, the external terminal 104 to which the power supply voltage $V_{CC}$ is applied is indicated as an external terminal 104 ($V_{CC}$). The external terminal 104 to which the ground voltage $V_{SS}$ is applied is indicated as an external terminal 104 ($V_{SS}$).

The jumper block 105 includes a plurality of jumper switches disposed corresponding to the plurality of connector pins 103. For example, as exemplified in FIG. 5, when 93 connector pins 103 are disposed corresponding to one socket 102, the jumper block 105 includes at least 93 jumper switches. The respective jumper switches can electrically connect the plurality of (for example, 35) connector pins 103 disposed corresponding to the plurality of (35 in the example of FIG. 3 and FIG. 4) sockets 102 to the external terminal 104 ($V_{CC}$) and to the external terminal 104 ($V_{SS}$).

[Wiring Substrate 101]

Figure 6:
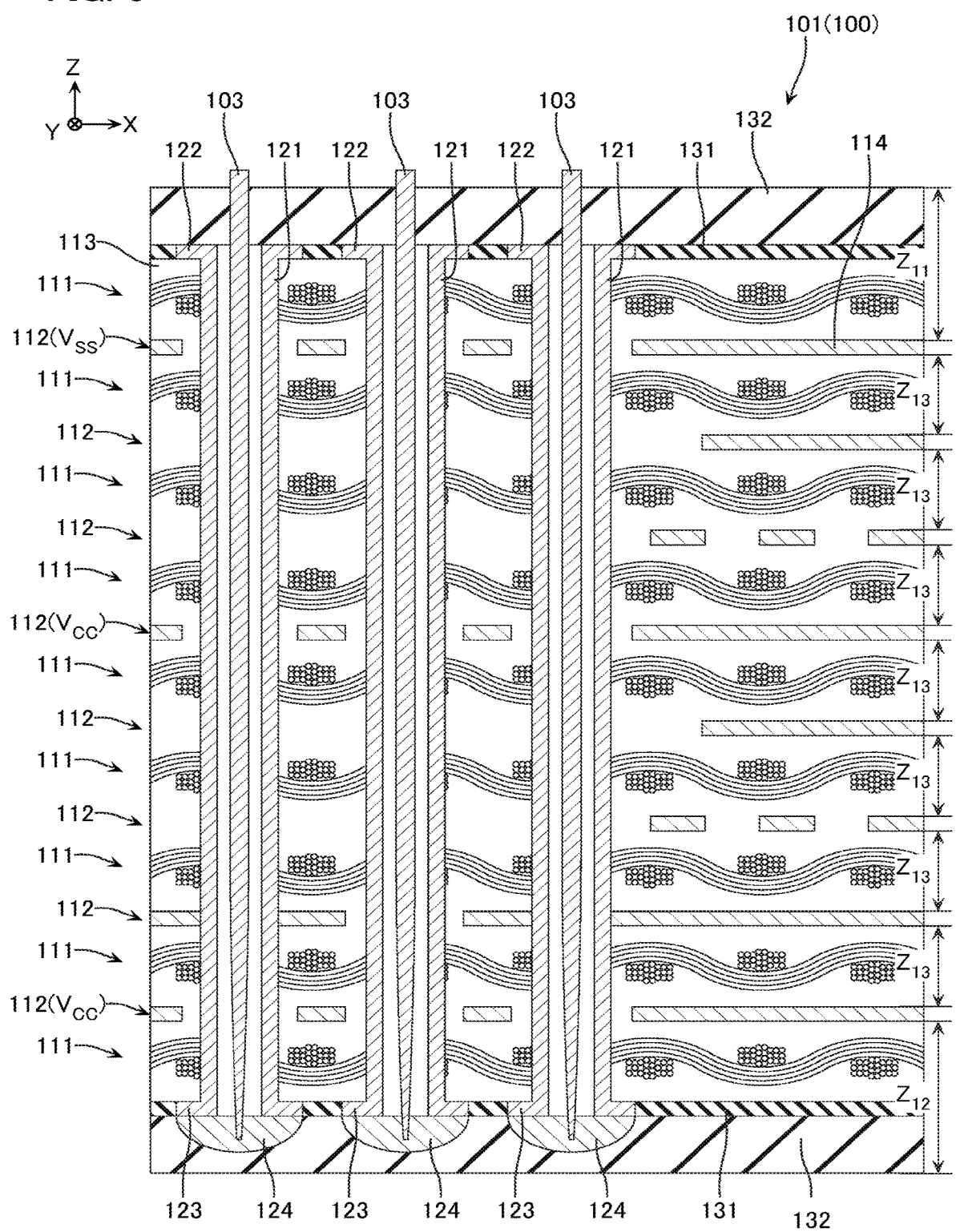
FIG. 6 is a schematic cross-sectional view illustrating a configuration of a part of a wiring substrate 101.

FIG. 6 is a schematic cross-sectional view illustrating a configuration of a part of the wiring substrate 101. The wiring substrate 101 includes a plurality of glass clothes 111 and a plurality of wiring layers 112 alternately stacked in a Z-direction. In regions between these plurality of glass clothes 111 and the respective adjacent plurality of wiring layers 112, an upper surface of the glass cloth 111 of the uppermost layer and a lower surface of the glass cloth 111 of the lowermost layer, a resin 113 is disposed. The wiring substrate 101 includes electrically conductive through-members 121 that pass through the plurality of glass clothes 111, the plurality of wiring layers 112, and the resin 113 to extend in the Z-direction. Into the through-member 121, the connector pin 103 described above is inserted. On an upper surface and a lower surface of the resin 113, solder resists 131 and waterproof coats 132 are disposed.

The glass cloth 111 is an insulating woven fabric made of glass fiber.

Each of wiring layers 112 includes a wiring 114. The wiring 114 contains copper (Cu). FIG. 6 exemplifies the eight wiring layers 112 arranged in the Z-direction. In the illustrated example, the power supply voltage $V_{CC}$ is applied to first and fifth wiring layers 112 from the below. That is, the wirings 114 in the first and fifth wiring layers 112 from the below are electrically conductive with the external terminal 104 (FIG. 3) corresponding to the power supply voltage $V_{CC}$. In the illustrated example, the ground voltage $V_{SS}$ is applied to first wiring layer 112 from above. That is, the wiring 114 in the first wiring layer 112 from above is electrically conductive with the external terminal 104 (FIG. 3) corresponding to the ground voltage $V_{SS}$.

FIG. 6 indicates a distance $Z_{11}$ from an upper surface of the wiring substrate 101 (an upper surface of the waterproof coat 132 disposed on the upper side) to an upper surface of the wiring layer 112 closest to this upper surface in the Z-direction. Additionally, FIG. 6 indicates a distance $Z_{12}$ from a lower surface of the wiring substrate 101 (a lower surface of the waterproof coat 132 disposed on the lower side) to a lower surface of the wiring layer 112 closest to this lower surface in the Z-direction. Additionally, FIG. 6 indicates two wiring layers 112 adjacent in the Z-direction and a distance $Z_{13}$ from a lower surface of one of the two wiring layers 112 disposed on the upper side to an upper surface of the other of the two wiring layers 112 disposed on the lower side. The distance $Z_{11}$ and the distance $Z_{12}$ are larger than the distance $Z_{13}$ by an amount of thicknesses of the solder resist 131 and the waterproof coat 132.

The resin 113 is insulating resin, such as epoxy resin. Respective plurality of parts disposed in regions between the respective adjacent plurality of wiring layers 112 of the resin 113 constitute insulating layers together with the glass clothes 111. A part disposed on an upper surface of the wiring layer 112 on the uppermost layer of the resin 113 and a part disposed on a lower surface of the wiring layer 112 on the lowermost layer each constitute an insulating layer together with the glass cloth 111, the solder resist 131, and the waterproof coat 132.

The through-members 121 are disposed to be divided into a plurality of (for example, 35) groups. These plurality of groups are arranged in the X-direction and the Y-direction in a pattern corresponding to the sockets 102. These plurality of groups each include a plurality of (for example, 93) through-members 121. These plurality of through-members 121 are arranged in the X-direction and the Y-direction in a pattern (see FIG. 5) corresponding to the connector pins 103. The through-member 121 contains copper (Cu). The through-member 121 includes a cylinder portion having an approximately cylindrical shape extending in the Z-direction. A land 122 is formed on an upper end of the cylinder portion. A land 123 is formed on a lower end of the cylinder portion. The lands 122, 123 have an approximately disc shape. A solder 124 is disposed on a lower surface of the land 123. The through-member 121 and the connector pin 103 are electrically conductive via the solder 124.

Diameters of the lands 122, 123 are larger than an outer diameter of the cylinder portion of the through-member 121 and is 0.3 mm or less. Here, the through-members 121 are arranged in the X-direction and the Y-direction at a pitch of around 0.5 mm corresponding to the plurality of terminals 13 (FIG. 2) disposed on the back surface 12 of the semiconductor device 10. Accordingly, a distance between the two lands 122, 123 adjacent in the X-direction or the Y-direction is 0.2 mm or more.

For example, a solder resist 131 has a glass-transition temperature higher than a temperature during a test. For example, when the test board 100 is used for HAST described later, the glass-transition temperature of the solder resist 131 is higher than the temperature during HAST (for example, 110° C.). The solder resist 131, for example, may have the glass-transition temperature of 116° C. The solder resist 131, for example, may be PSR-4000 D10ME of TAIYO HOLDINGS CO., LTD.

[Test Board 200 According to Comparative Example]

Next, the test board 200 according to the comparative example is described. The test board 200 according to the comparative example includes a wiring substrate 201 instead of the wiring substrate 101.

Figure 7:
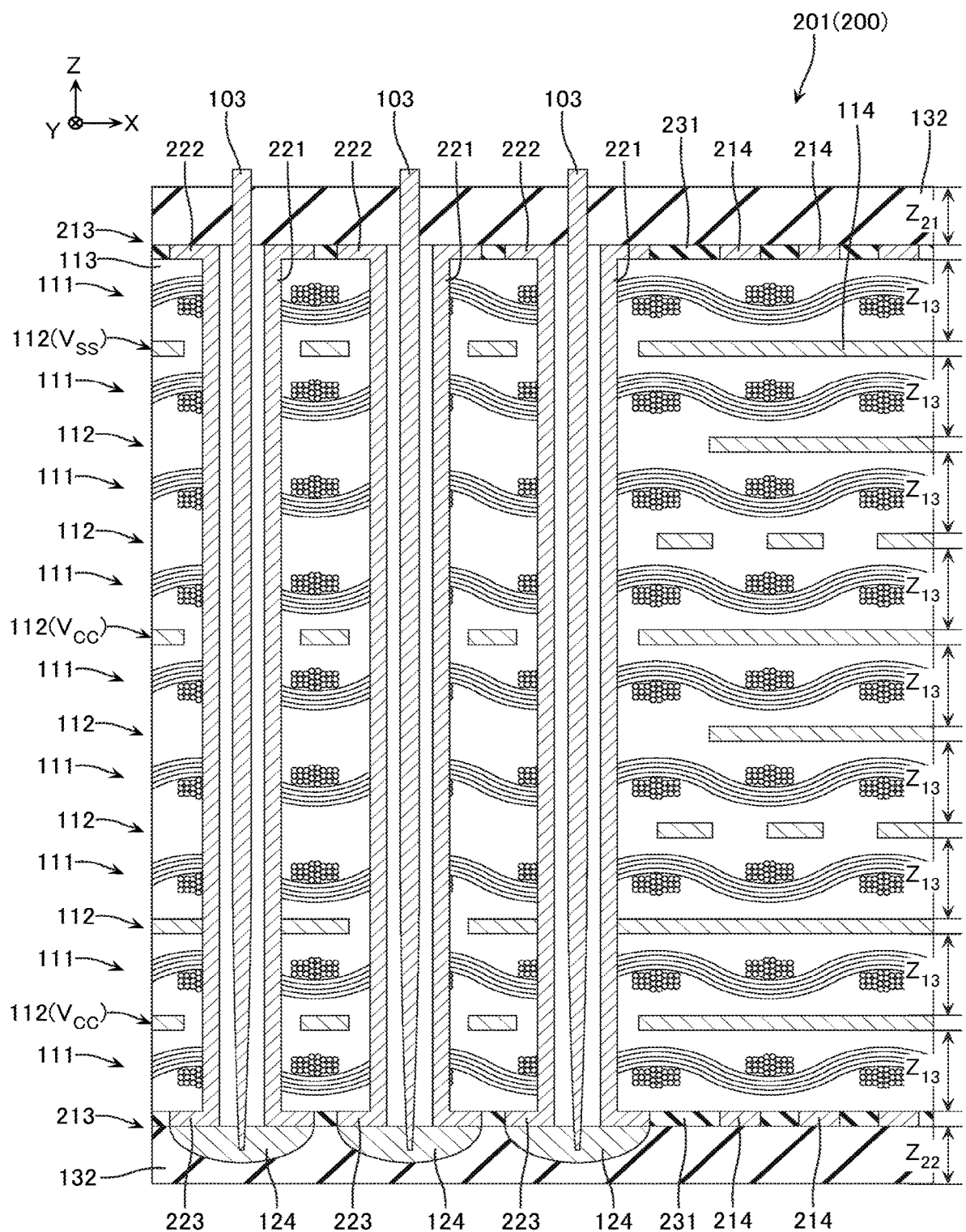
FIG. 7 is a schematic cross-sectional view illustrating a configuration of a part of a wiring substrate 201.

FIG. 7 is a schematic cross-sectional view illustrating a configuration of a part of the wiring substrate 201.

The wiring substrate 201 includes wiring layers 213 disposed on an upper surface and a lower surface of the resin 113. Each of the wiring layers 213 includes a wiring 214. The wiring 214 contains copper (Cu).

FIG. 7 indicates a distance $Z_{21}$ in the Z-direction from an upper surface of the wiring substrate 201 to an upper surface of the wiring layer 213 closest to this upper surface. Additionally, FIG. 7 indicates a distance $Z_{22}$ in the Z-direction from a lower surface of the wiring substrate 201 to a lower surface of the wiring layer 213 closest to this lower surface. Additionally, FIG. 7 indicates two wiring layers 112, 213 adjacent in the Z-direction and a distance $Z_{13}$ in the Z-direction from a lower surface of one of the two wiring layers disposed on the upper side to an upper surface of the other of the two wiring layers disposed on the lower side. The distance $Z_{21}$ and the distance $Z_{22}$ are approximately the same as a thickness of the waterproof coat 132 and are smaller than the distance $Z_{13}$.

In the illustrated example, the upper surface of the wiring substrate 201 is the upper surface of the waterproof coat 132 disposed on the upper side. The lower surface of the wiring substrate 201 is the lower surface of the waterproof coat 132 disposed on a lower side.

The wiring substrate 201 includes through-members 221 instead of the through-members 121. The through-member 221 includes a cylinder portion having an approximately cylindrical shape extending in the Z-direction. The land 222 is formed on the upper end of the cylinder portion. The land 223 is formed on the lower end of the cylinder portion.

Diameters of the lands 222, 223 are 0.4 mm. Here, a part of the through-members 221 are arranged in the X-direction and the Y-direction at a pitch of around 0.5 mm corresponding to the plurality of terminals 13 (FIG. 2) disposed on the back surface 12 of the semiconductor device 10. Accordingly, a distance between the two lands 222, 223 adjacent in the X-direction or the Y-direction is around 0.1 mm.

The wiring substrate 201 includes solder resists 231 instead of the solder resists 131. The solder resist 231, for example, has the glass-transition temperature of 106° C. The solder resist 231, for example, may be PSR-4000 SP19 of TAIYO HOLDINGS CO., LTD.

[Test]

The test boards 100, 200 are usable for a test of the semiconductor device 10. An example of this test includes High Accelerated temperature and humidity Stress Test (HAST). However, the "test" in this specification is not limited to HAST.

In HAST, the semiconductor device 10 is set to the test boards 100, 200 to conduct the test. In HAST, the semiconductor device 10 is placed under a high temperature and high humidity environment, and in this state, a fixed voltage is applied to each of the terminals 13 (FIG. 2) for a predetermined time. In this respect, the semiconductor device 10 is, for example, placed under an environment at 110° C. Next, the semiconductor device 10 is removed from the test boards 100, 200 and the semiconductor device 10 is measured by a tester. For example, data is read out or written to the semiconductor device 10 to confirm whether or not the semiconductor device 10 normally operates.

First Experiment

In HAST, the test boards 100, 200 are placed under a high temperature and high humidity environment for a comparatively long time and energized. Therefore, for example, when the test is conducted for several times, the test board 200 according to the comparative example is broken down. More specifically, leakage current is generated.

Therefore, the inventors created a first sample similarly to the test board 200 according to the comparative example and conducted a first experiment to examine the cause of leakage current. Hereinafter, the examination content is described.

FIG. 8 to FIG. 12 are schematic plan views illustrating configurations of parts of the first sample.

The first sample was basically configured similarly to the test board 200 according to the comparative example.

Figure 8:
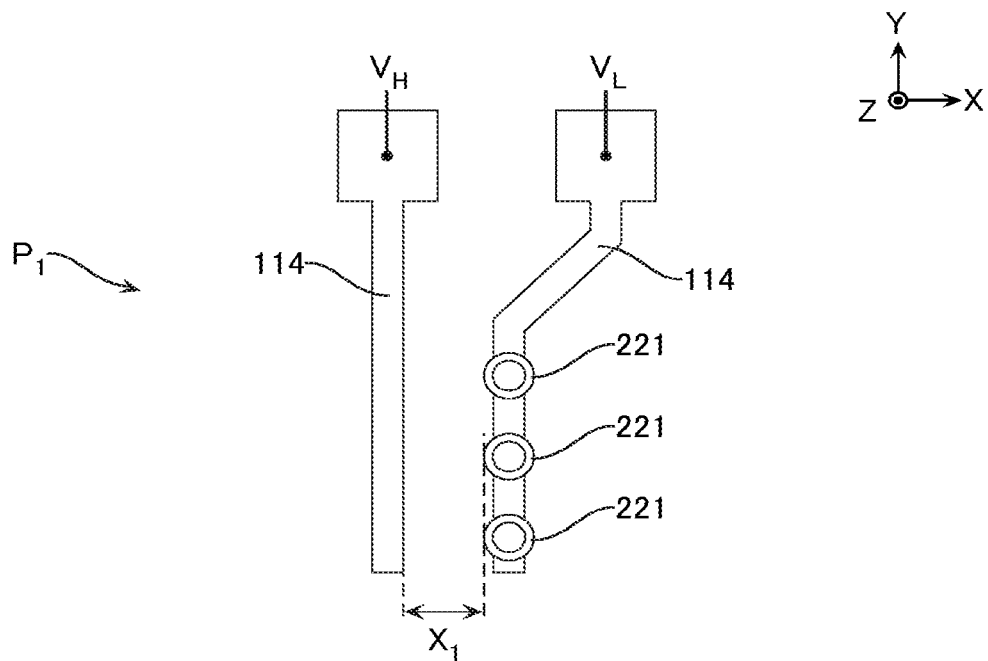
FIG. 8 is a schematic plan view illustrating a configuration of a part of a first sample.

However, in the first sample, in the wiring layer 112, a plurality of patterns $P_1$ as illustrated in FIG. 8 were formed. The pattern $P_1$ includes a pair of the wirings 114. One wiring 114 is connected to the plurality of through-members 221. A voltage $V_L$ is applied to the one wiring 114, and a voltage $V_H$ is applied to the other wiring 114. FIG. 8 indicates a distance between the through-member 221 connected to the one wiring 114 and the other wiring 114 as a distance $X_1$. In the first sample, four patterns $P_1$ in which the distances $X_1$ were 0.1 mm, 0.2 mm, 0.3 mm, and 0.5 mm were formed.

Figure 9:
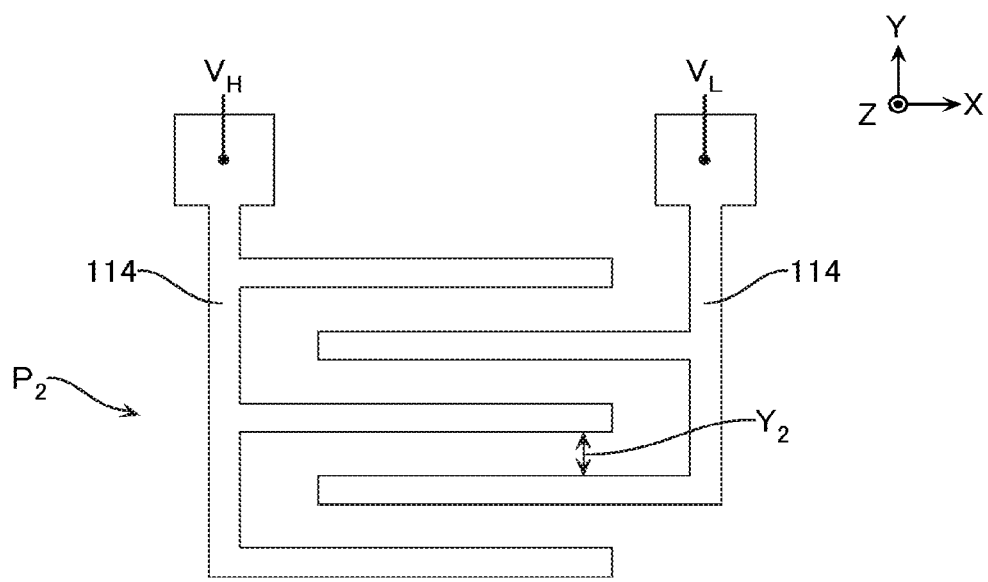
FIG. 9 is a schematic plan view illustrating the configuration of a part of the first sample.

In the first sample, in the wiring layer 112, a plurality of patterns $P_2$ as illustrated in FIG. 9 were formed. The pattern $P_2$ includes the pair of wirings 114. Each of these two wirings 114 has a comb-like shape. FIG. 9 indicates a distance between two wirings that extend in the X-direction and are adjacent in the Y-direction as a distance $Y_2$. In the first sample, four patterns $P_2$ in which the distances $Y_2$ were 0.1 mm, 0.2 mm, 0.5 mm, and 1.0 mm were formed.

Figure 10:
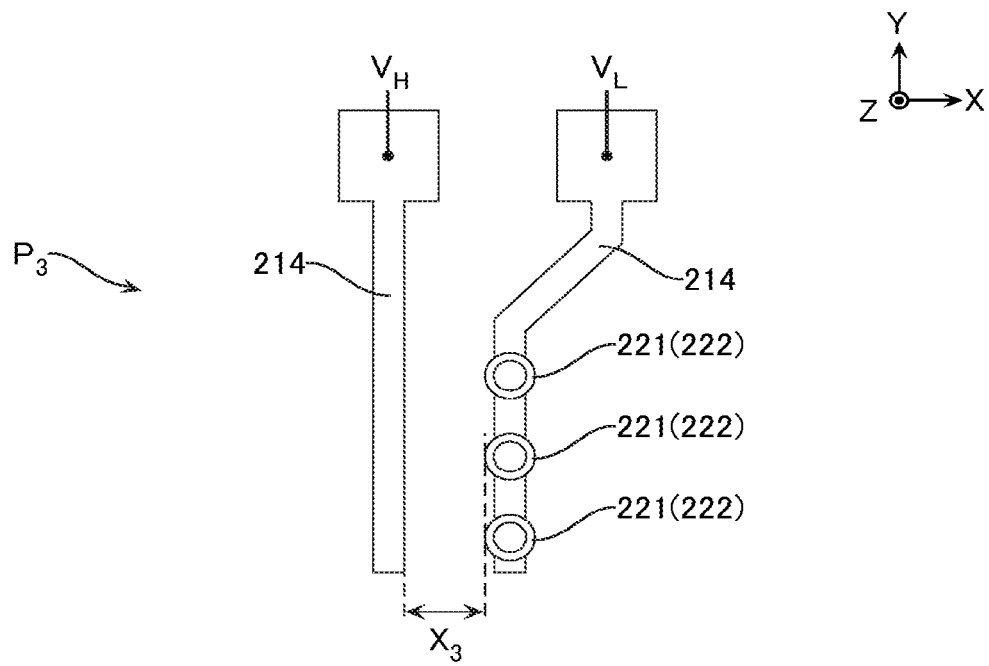
FIG. 10 is a schematic plan view illustrating the configuration of a part of the first sample.

In the first sample, in the wiring layer 213, a plurality of patterns $P_3$ as illustrated in FIG. 10 were formed. The pattern $P_3$ includes a pair of the wirings 214. One wiring 214 is connected to the plurality of through-members 221. The voltage $V_L$ is applied to the one wiring 214, and the voltage $V_H$ is applied to the other wiring 214. FIG. 10 indicates a distance between the through-member 221 connected to the one wiring 214 and the other wiring 214 as a distance $X_3$. In the first sample, four patterns $P_3$ in which the distances $X_3$ were 0.1 mm, 0.2 mm, 0.3 mm, and 0.5 mm were formed.

Figure 11:
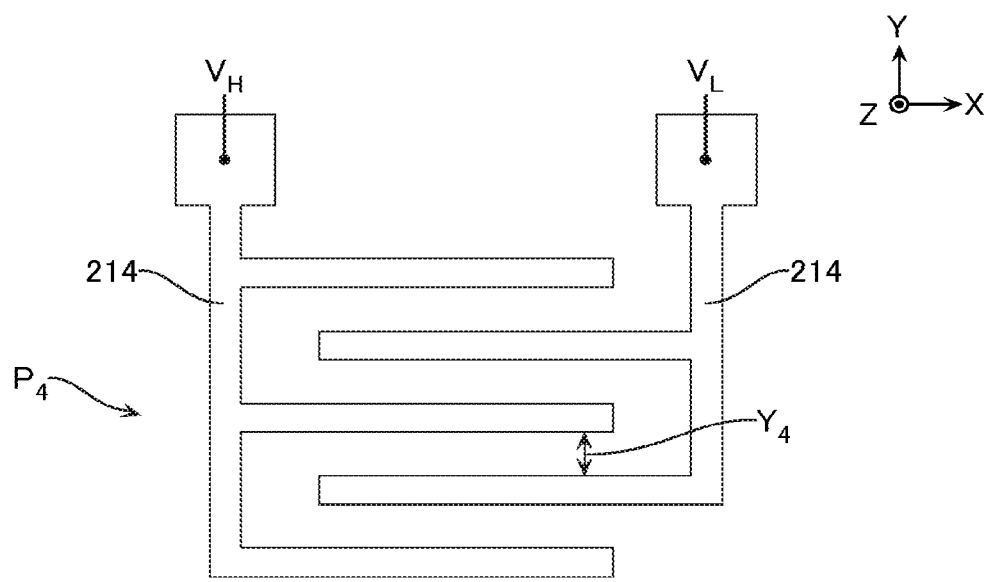
FIG. 11 is a schematic plan view illustrating the configuration of a part of the first sample.

In the first sample, in the wiring layer 213, a plurality of patterns $P_4$ as illustrated in FIG. 11 were formed. The pattern $P_4$ includes the pair of wirings 214. Each of these two wirings 214 has a comb-like shape. The voltage $V_L$ is applied to the one wiring 214, and the voltage $V_H$ is applied to the other wiring 214. FIG. 11 indicates a distance between two wirings that extend in the X-direction and are adjacent in the Y-direction as a distance $Y_4$. In the first sample, four patterns $P_4$ in which the distances $Y_4$ were 0.1 mm, 0.2 mm, 0.5 mm, and 1.0 mm were formed.

Figure 12:
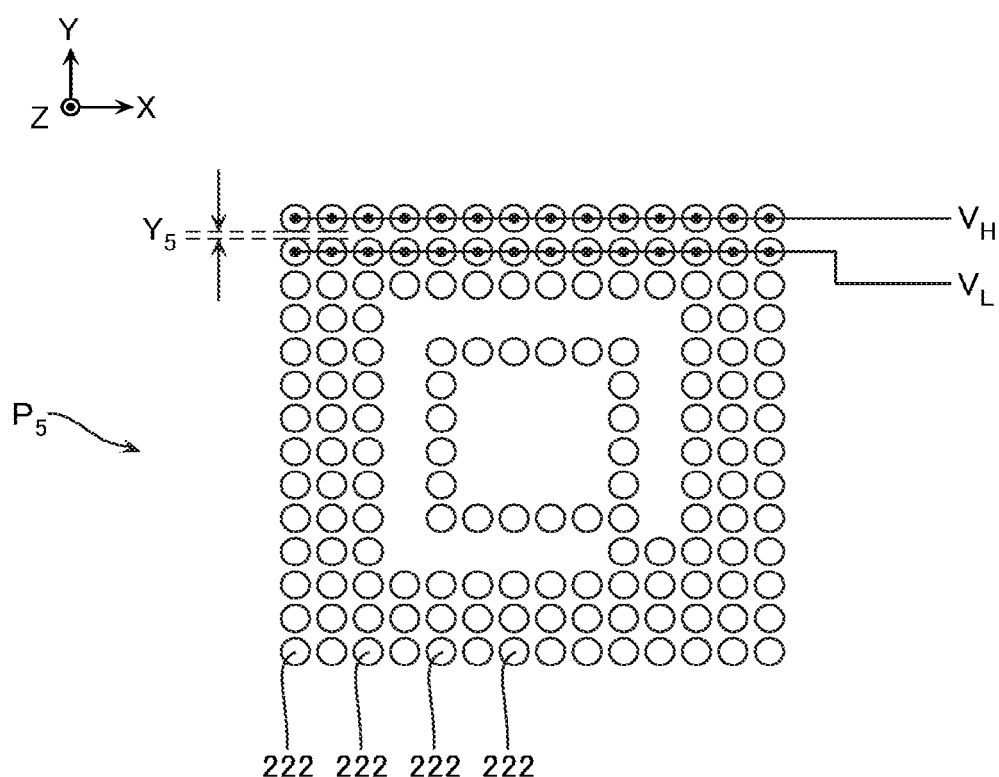
FIG. 12 is a schematic plan view illustrating the configuration of a part of the first sample.

In the first sample, a plurality of patterns $P_5$ as illustrated in FIG. 12 were formed. The pattern $P_5$ includes a plurality of the lands 222 (a plurality of the through-members 221) arranged in the X-direction and the Y-direction. To the plurality of lands 222 arranged in the X-direction, the voltage $V_L$ or the voltage $V_H$ is applied in common. Different voltages are applied to two lands 222 adjacent in the Y-direction. FIG. 12 indicates a distance between the two lands 222 adjacent in the Y-direction as a distance $Y_5$. In the first sample, the pattern $P_5$ in which the distance $Y_5$ was 0.1 mm was formed. Additionally, in the first sample, another pattern $P_5$ in which even-numbered lands 222 counted from one side in the Y-direction (even-numbered through-members 221 counted from one side in the Y-direction) are omitted, and thus the distance $Y_5$ is 0.6 mm was formed.

In the first experiment, the first sample was placed under a high temperature and high humidity environment under a condition harder than HAST, and the voltage $V_L$ and the voltage $V_H$ were applied to measure a resistance value between the terminals. A difference between the voltage $V_L$ and the voltage $V_H$ is larger than a difference between the ground voltage $V_{SS}$ and the power supply voltage $V_{CC}$. A time from the start of the test until a decrease in a resistance value (generation of leak current) was measured.

In the first experiment, leakage current did not occur in the pattern $P_1$ (FIG. 8) or the pattern $P_2$ (FIG. 9).

Figure 13:
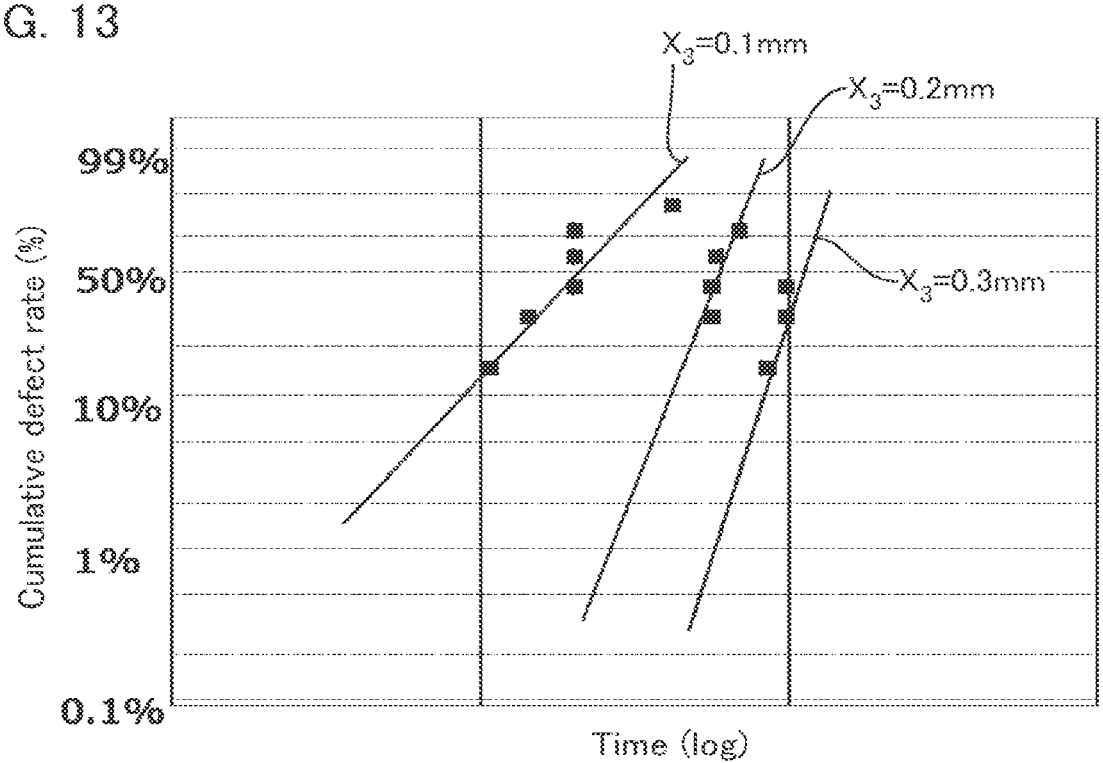
FIG. 13 is a graph illustrating a result of a first experiment.

Next, with reference to FIG. 13, an occurrence rate of leakage current in the pattern $P_3$ (FIG. 10) is described. FIG. 13 is a graph illustrating a result of the first experiment. The horizontal axis of FIG. 13 indicates the time from the start of experiment until leakage current occurs by a logarithmic axis. The vertical axis of FIG. 13 indicates a cumulative defect rate. As illustrated in FIG. 13, as the distance $X_3$ described with reference to FIG. 10 increased, the time until the leakage current occurred became long. With the distance $X_3$ of 0.5 mm, leakage current did not occur.

Figure 14:
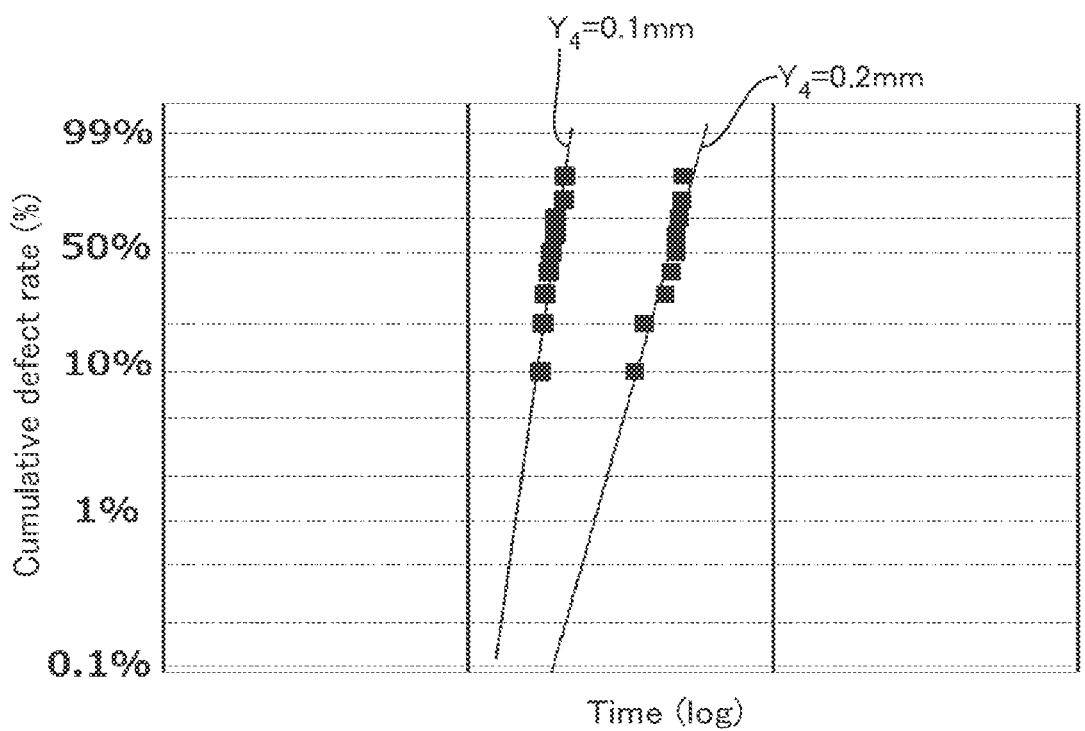
FIG. 14 is a graph illustrating the result of the first experiment.

Next, with reference to FIG. 14, an occurrence rate of leakage current in the pattern $P_4$ (FIG. 11) is described. FIG. 14 is a graph illustrating a result of the first experiment. The horizontal axis of FIG. 14 indicates the time from the start of experiment until leakage current occurs by a logarithmic axis. The vertical axis of FIG. 14 indicates a cumulative defect rate. As illustrated in FIG. 14, as the distance $Y_4$ described with reference to FIG. 11 increased, the time until the leakage current occurred became long. With the distance $Y_4$ of 0.5 mm and 1.0 mm, leakage current did not occur.

Figure 15:
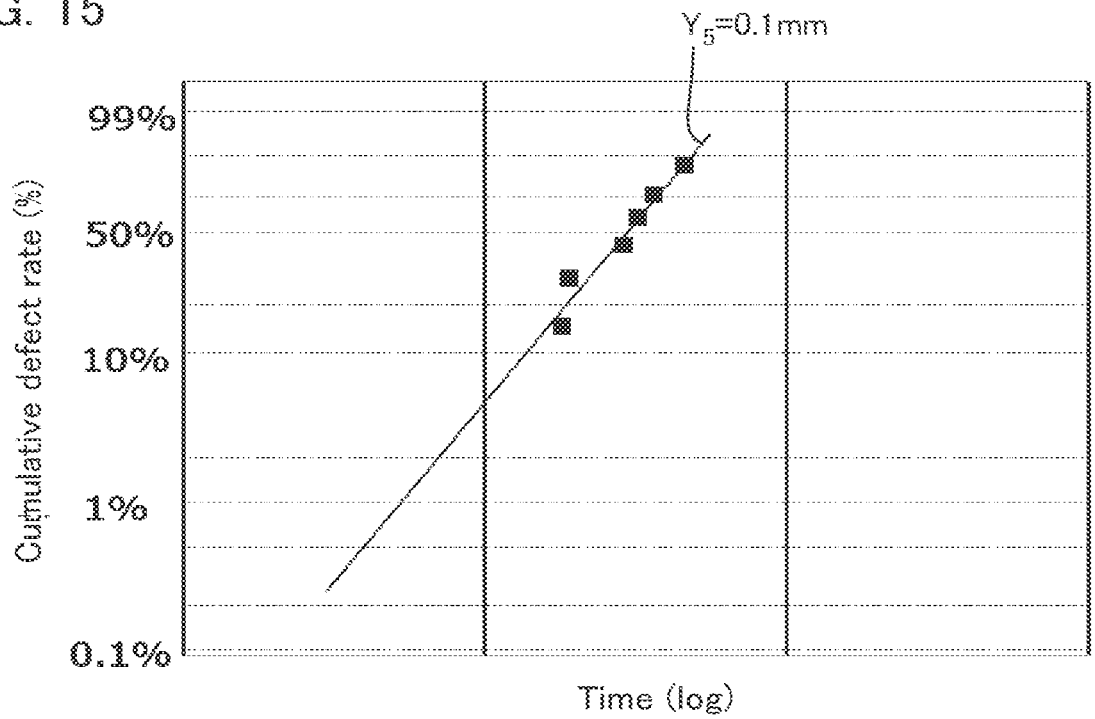
FIG. 15 is a graph illustrating the result of the first experiment.

Next, with reference to FIG. 15, an occurrence rate of leakage current in the pattern $P_5$ (FIG. 12) is described. FIG. 15 is a graph illustrating a result of the first experiment. The horizontal axis of FIG. 15 indicates the time from the start of experiment until leakage current occurs by a logarithmic axis. The vertical axis of FIG. 15 indicates a cumulative defect rate. As illustrated in FIG. 15, when the distance $Y_5$ described with reference to FIG. 12 was 0.1 mm, leakage current occurred. On the other hand, with the distance $Y_5$ of 0.6 mm, leakage current did not occur.

After conducting the first experiment, the inventors observed the part where the leakage current occurred. As a result, in the pattern $P_3$ (FIG. 10), it was observed that copper (Cu) in the wiring 214 to which the voltage $V_H$ was applied was diffused into the solder resist 231 and reached the land 222 to which the voltage $V_L$ was applied. Similarly, in the pattern $P_4$ (FIG. 11), it was observed that copper (Cu) in the wiring 214 to which the voltage $V_H$ was applied was diffused into the solder resist 231 and reached the wiring 214 to which the voltage $V_L$ was applied. Similarly, in the pattern $P_5$ (FIG. 12), it was observed that copper (Cu) in the land 222 to which the voltage $V_H$ was applied was diffused into the solder resist 231 and reached the land 222 to which the voltage $V_L$ was applied.

Second Experiment

Considering the result of the first experiment, it is considered that when leakage current occurs in the test board 200, the solder resist 231 reaches the glass-transition temperature to soften and copper ion ($Cu^{2+}$) migrates in the softened solder resist 231. Considering this, it is considered that the occurrence of leakage current can be suppressed by changing the solder resist 231 to one having a high glass-transition temperature.

Therefore, the inventors created a second sample and conducted a second experiment. The second sample is basically configured similarly to the first sample. However, in the second sample, instead of the solder resist 231 according to the comparative example, the solder resist 131 according to the first embodiment is used.

The second experiment was conducted under a condition similarly to the first experiment.

Figure 16:
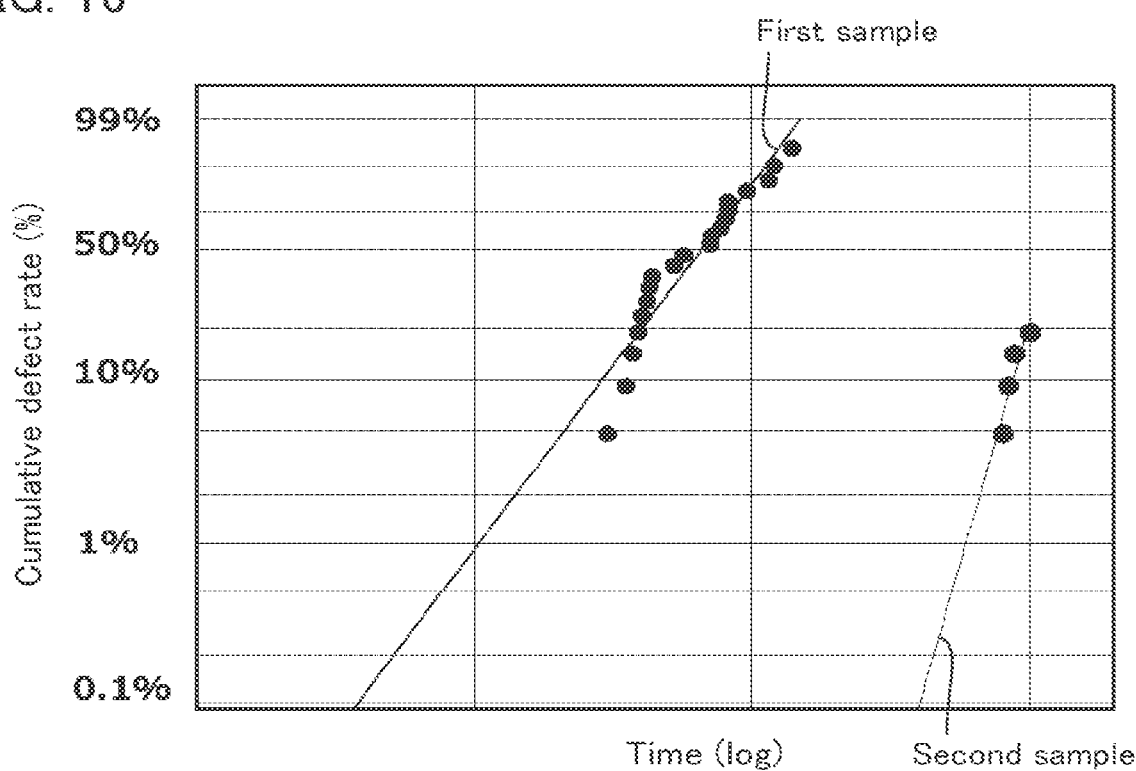
FIG. 16 is a graph illustrating a result of a second experiment.

FIG. 16 is a graph illustrating a result of the second experiment. The horizontal axis of FIG. 16 indicates the time from the start of experiment until leakage current occurs by a logarithmic axis. The vertical axis of FIG. 16 indicates a cumulative defect rate. FIG. 16 also illustrates the result of the first experiment for comparison. As a result of the second experiment, it has been found that when the solder resist 131 is used instead of the solder resist 231, the time from the start of the test until the decrease in the resistance value (occurrence of leakage current) extends 10 times or more.

Third Experiment

In the result of the first experiment, a defect did not occur in the patterns $P_1$, $P_2$ in the wiring layer 112, and a defect occurred in the patterns $P_3$, $P_4$ in the wiring layer 213. Therefore, it is considered to omit the wiring layer 213 (wiring 214) from the aspect of long life of the test board.

Here, in the result of the first experiment, a defect also occurred in the pattern $P_5$. Therefore, it is considered to omit the lands 222, 223 from the aspect of long life of the test board. However, it is difficult to omit the lands 222, 223.

Here, it is considered that even in a case where the lands 222, 223 are not omitted, as long as a distance between the lands 222, 223 can be expanded, the long life of the test board can be achieved.

Figure 17:
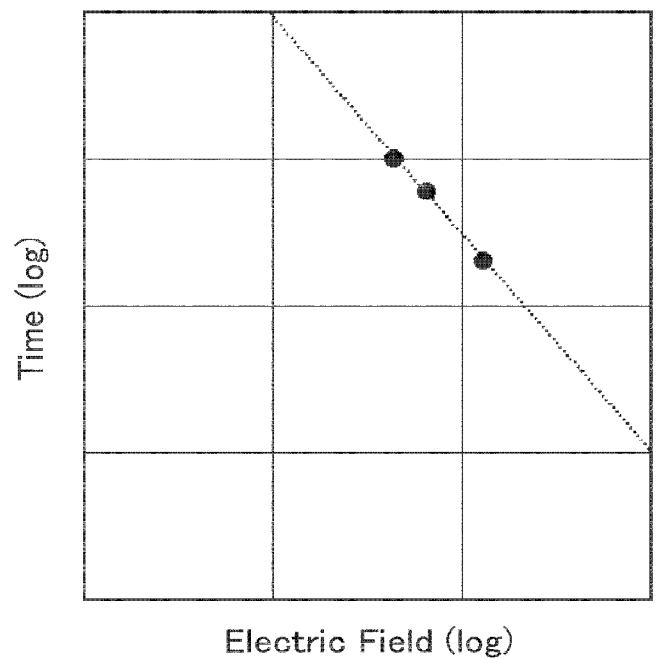
FIG. 17 is a graph illustrating the result of the first experiment.

For example, FIG. 17 is a graph illustrating the result of the first experiment. The graph of FIG. 17 plots data corresponding to the graph of FIG. 13 from another aspect. The horizontal axis of FIG. 17 indicates an electric field between wirings or the like by a logarithmic axis. The vertical axis of FIG. 17 indicates the time from the start of experiment until leakage current occurs by a logarithmic axis. As illustrated in FIG. 17, when the electric field between the wirings or the like is decreased, the time until leakage current occurs can be long. It is considered that, to decrease the electric field between the wirings or the like, for example, the distance between the wirings or the like is expanded. Therefore, it is considered that, by expanding the distance between the lands 222, 223, the long life of the test board can be achieved.

Therefore, the inventors created a third sample and conducted a third experiment. The third sample is basically configured similarly to the second sample. However, in the third sample, the distance $Y_5$ described with reference to FIG. 12 is 0.2 mm.

The third experiment was conducted under the condition similarly to the first experiment. As a result, a defect did not occur in the third experiment.

[Effect of Test Board 100 According to First Embodiment]

In the test board 100 according to the first embodiment, considering the results of the first experiment and the second experiment, the solder resist 131 is used instead of the solder resist 231. Therefore, the test board 100 has life longer than the test board 200 according to the comparative example.

In the test board 100 according to the first embodiment, considering the result of the first experiment, the wiring layer 213 is omitted. Therefore, the test board 100 has life longer than the test board 200 according to the comparative example.

In the test board 100 according to the first embodiment, since the wiring layer 213 is omitted, as described with reference to FIG. 6, the distance $Z_{11}$ and the distance $Z_{12}$ are larger than the distance $Z_{13}$ by the amount of thicknesses of the solder resist 131 and the waterproof coat 132.

In the test board 100 according to the first embodiment, considering the results of the first experiment and the third experiment, the distance between the two lands 122, 123 adjacent in the X-direction or the Y-direction is configured to be 0.2 mm or more. Therefore, the test board 100 has life longer than the test board 200 according to the comparative example.

[Test Board According to Second Embodiment]

Figure 18:
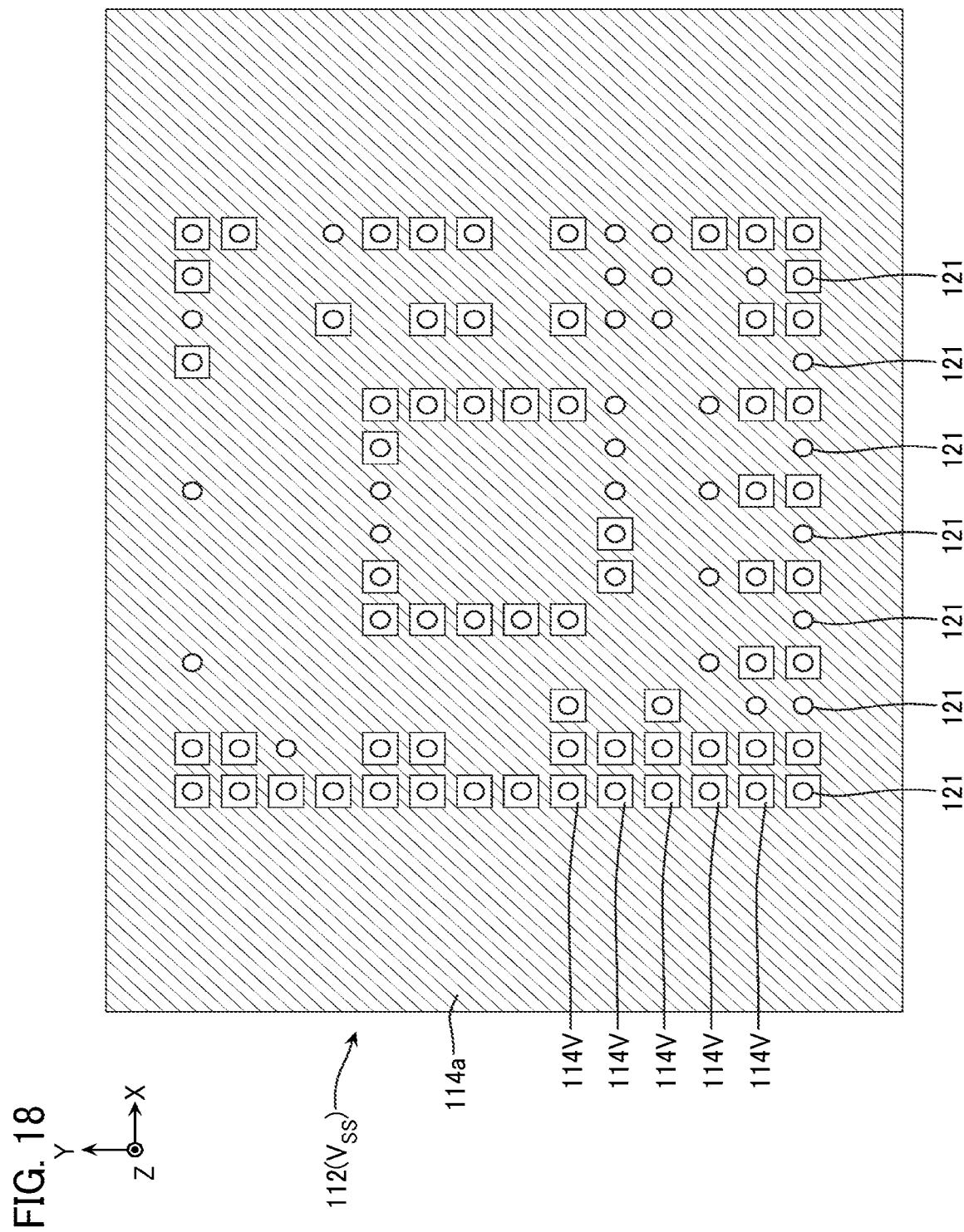
FIG. 18 is a schematic plan view illustrating a configuration of a part of a plurality of wiring layers 112.

FIG. 18 is a schematic plan view illustrating a configuration of a part of a plurality of the wiring layers 112 described with reference to FIG. 6. As illustrated in FIG. 18, a part of the plurality of wiring layers 112 (for example, the wiring layers 112 to which the power supply voltage $V_{CC}$ is applied and the wiring layer 112 to which the ground voltage $V_{SS}$ is applied) include a solid wiring 114a as the wiring 114. The solid wiring 114a is an approximately plate-shaped wiring extending in the X-direction and the Y-direction.

The solid wiring 114a includes a plurality of cavity portions 114V arranged in the X-direction and the Y-direction corresponding to the plurality of through-members 121. The cavity portions 114V are disposed to be divided into a plurality of (for example, 35) groups. These plurality of groups are arranged in the X-direction and the Y-direction in a pattern corresponding to the sockets 102. These plurality of groups each include the plurality of cavity portions 114V. For example, as illustrated in FIG. 18, these plurality of cavity portions 114V are arranged in the X-direction and the Y-direction in a pattern corresponding to a part of the connector pins 103.

The through-member 121 in the cavity portion 114V is spaced from the solid wiring 114a via the resin 113 and insulated from the solid wiring 114a. A part of the through-members 121 (for example, the through-member 121 electrically conductive with the external terminal 104 (FIG. 3) corresponding to the power supply voltage $V_{CC}$ or the ground voltage $V_{SS}$) contacts the solid wiring 114a on an outer peripheral surface and is electrically conductive with the solid wiring 114a.

The "cavity portion" of the wiring in this specification means a region that does not include a metal member constituting the wiring and a region surrounded over the whole circumference by the metal member constituting the wiring in an XY plane. For example, when a line and space pattern is formed in any of the wiring layers and a plurality of wirings corresponding to the line part of this line and space are electrically independent, the metal member is not included in the region of the space part. However, the region of this space part is not surrounded over the whole circumference by the metal member constituting any of the wirings. Therefore, the region of this space part is not equivalent to the "cavity portion" in this specification.

Here, it is considered that since the solid wiring 114a has a metal volume larger than a metal volume of the wiring 114 in another wiring layer 112, electromigration is comparatively likely to occur in the solid wiring 114a. For example, hillock is formed in the cavity portion 114V by electromigration, and when this hillock contacts the through-member 121, leakage current occurs.

Therefore, the solid wiring 114a is not used in the second embodiment.

Figure 19:
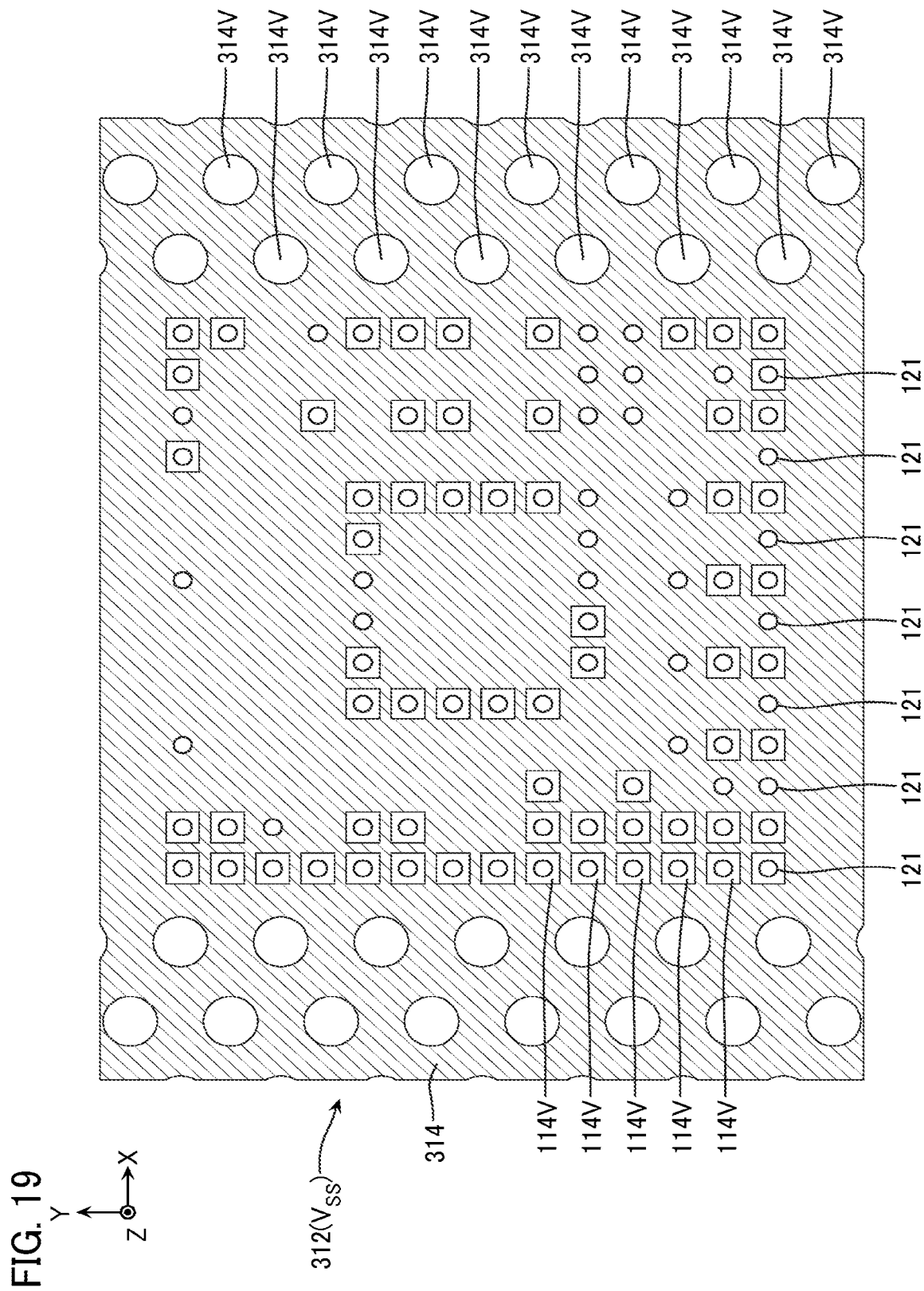
FIG. 19 is a schematic plan view illustrating a configuration of a part of a test board according to a second embodiment.

FIG. 19 is a schematic plan view illustrating a configuration of a part of a test board according to the second embodiment. The test board according to the second embodiment is basically configured similarly to the test board 100 according to the first embodiment. However, the test board according to the second embodiment includes a plurality of wiring layers 312 instead of the part of the plurality of wiring layers 112 (for example, the wiring layers 112 to which the power supply voltage $V_{CC}$ is applied and the wiring layer 112 to which the ground voltage $V_{SS}$ is applied).

The wiring layer 312 is configured basically similarly to the wiring layer 112. However, the wiring layer 312 includes a wiring 314 instead of the solid wiring 114a. The wiring 314 is configured basically similarly to the solid wiring 114a. However, the wiring 314 includes a plurality of cavity portions 314V in addition to the cavity portions 114V corresponding to the through-members 121. The cavity portion 114V includes the through-member 121. On the other hand, the cavity portion 314V does not include the through-member 121. In the illustrated example, each of the plurality of cavity portions 314V is larger than the cavity portion 114V and formed in a circular shape.

As described above, the cavity portions 114V are disposed to be divided into a plurality of (for example, 35) groups. These plurality of groups are arranged in the X-direction and the Y-direction in a pattern corresponding to the sockets 102. Here, in the example of FIG. 19, the plurality of cavity portions 314V are disposed in a region not corresponding to the sockets 102 (a region not overlapping with the sockets 102 viewed in the Z-direction).

The plurality of cavity portions 314V are disposed in a staggered pattern. For example, in FIG. 19, a plurality of rows formed of the plurality of cavity portions 314V arranged in the Y-direction are arranged in the X-direction. A position of one of the cavity portions 314V in the Y-direction included in one of two rows adjacent in the X-direction is different from a position of the nearest one of the cavity portions 314V in the Y-direction included in the other.

Here, in the wiring 314, the plurality of cavity portions 314V are formed. This configuration includes many clearances such that metal atoms constituting the wiring 314 can escape. Therefore, it can be reduced that the hillock described above is formed in the cavity portion 114V.

The cavity portion 314V is formed in the circular shape. Thus, for example, compared with a case of forming the rectangular cavity portion 314V, it is possible to suppress the current inhibition in the wiring 314 and an increase in a resistance value in association with formation of the cavity portion 314V can be reduced.

The cavity portions 314V are disposed in a staggered pattern. Thus, for example, compared with a case where the cavity portions 314V are disposed in a matrix pattern, it is possible to suppress the current inhibition in the wiring 314 and an increase in a resistance value in association with formation of the cavity portion 314V can be reduced.

The pattern illustrated in FIG. 19 is merely an example, and a specific pattern is adjustable as necessary.

For example, the shape of the cavity portion 314V need not be the circular shape and may be the rectangular shape, and may be any polygonal shape including a regular hexagon and a triangular shape, or may be another shape.

For example, the X-direction and the Y-direction may be switched in the staggered pattern as illustrated in FIG. 19. That is, the plurality of rows formed of the plurality of cavity portions 314V arranged in the X-direction may be arranged in the Y-direction. A position of one of the cavity portions 314V in the X-direction included in one of the two rows adjacent in the Y-direction may be different from a position of the nearest one of the cavity portions 314V in the X-direction included in the other.

The size of the cavity portion 314V in the X-direction and the Y-direction may be larger than or smaller than the size of the cavity portion 114V in the X-direction and the Y-direction. These sizes may be the same. The sizes of the cavity portions 314V need not be uniform.

[Test Board According to Third Embodiment]

As described above, in the test boards according to the first embodiment and the second embodiment, when the solder resist 131 is used, the wiring layer 213 is omitted, and the distance between the two lands 122, 123 adjacent in the X-direction or the Y-direction is adjusted, the life longer than the test board according to the comparative example is achievable.

Here, when the inventors conducted an experiment using the test board according to the second embodiment, two phenomena that did not become apparent in the test board according to the comparative example were observed.

The first phenomenon is that peeling occurred between the glass cloth 111 (FIG. 6) and the resin 113 (FIG. 6), and metal ions constituting the through-member 121, such as copper, invade a cavity generated by this, and this shorts the two through-members 121.

The second phenomenon is that even when the solder resist 131 is used, the metal ions, such as copper, constituting the lands 122, 123 migrate in the solder resist 131, and the mutual lands 122 or the mutual lands 123 short.

Therefore, in the third embodiment, a test board that allows reducing occurrence of the two phenomena is described.

Figure 20:
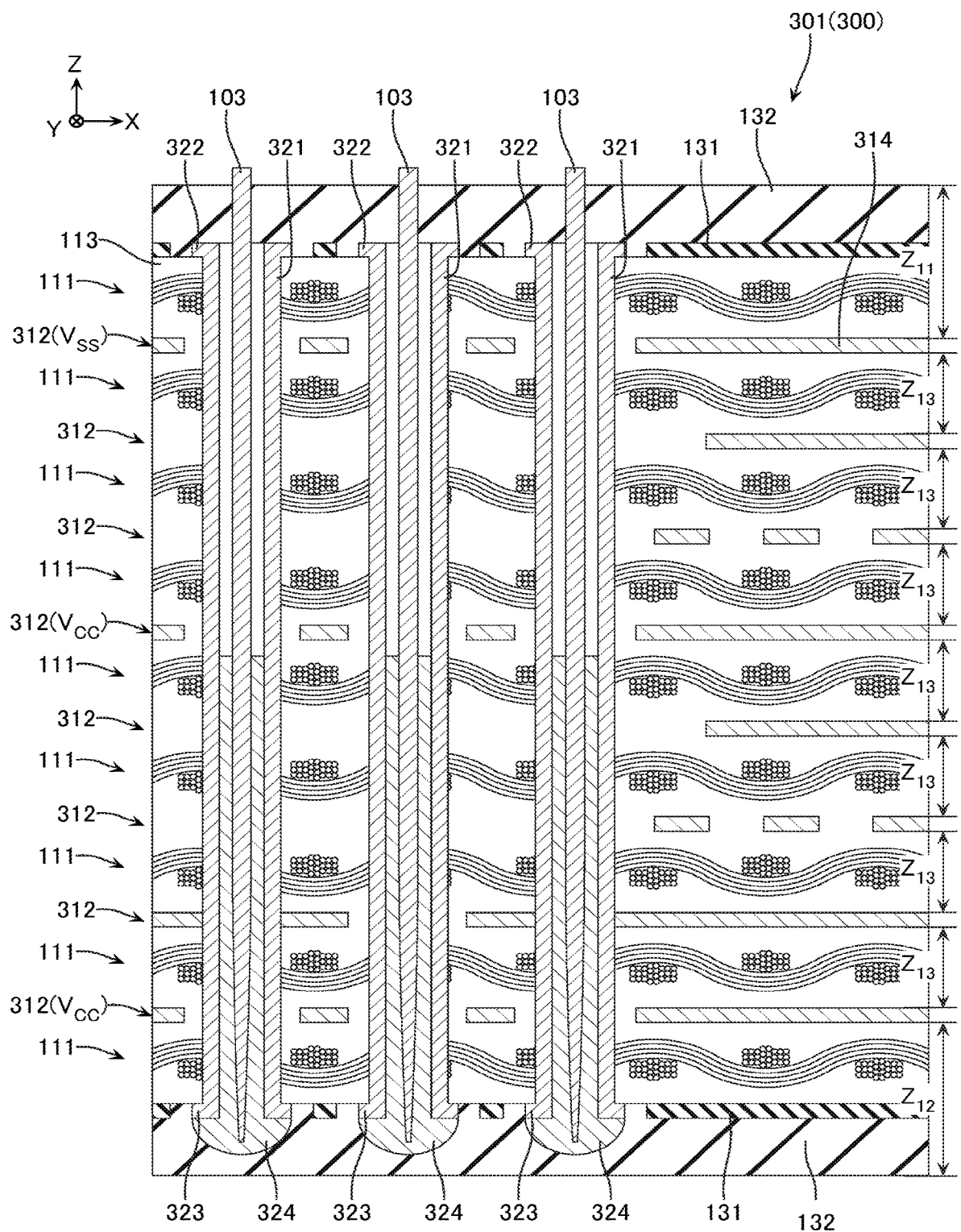
FIG. 20 is a schematic cross-sectional view illustrating a configuration of a part of a test board according to a third embodiment.

FIG. 20 is a schematic cross-sectional view illustrating a configuration of a part of a test board 300 according to the third embodiment. The test board 300 according to the third embodiment is configured basically similarly to the test board according to the second embodiment. However, the test board 300 according to the third embodiment includes a wiring substrate 301 instead of the wiring substrate 101.

The wiring substrate 301 is configured basically similarly to the wiring substrate 101 according to the second embodiment. However, the wiring substrate 301 includes a through-member 321 instead of the through-member 121.

The through-member 321 is configured basically similarly to the through-member 121. However, the through-member 321 includes lands 322, 323 instead of the lands 122, 123. The through-member 321 and the connector pin 103 are electrically conductive via a solder 324 instead of the solder 124.

The lands 322, 323 are configured basically similarly to the lands 122, 123. However, the lands 322, 323 are spaced from the solder resist 131. With this configuration, migration of the metal ions in the lands 322, 323 into the solder resist 131 can be preferably reduced.

The solder 324 has a part disposed on a lower surface of the land 323 and a part disposed between the through-member 321 and the connector pin 103. An upper end portion of the solder 324 is positioned between a lower surface of the land 322 and an upper surface of the land 323, that is, below the lower surface of the land 322 and above the upper surface of the land 323. In the illustrated example, the upper end portion of the solder 324 is disposed between a lower surface of the wiring layer 312 closest to an upper surface of the wiring substrate 301 and an upper surface of the wiring layer 312 closest to a lower surface of the wiring substrate 301. That is, the upper end portion of the solder 324 is positioned below the lower surface of the wiring layer 312 closest to the upper surface of the wiring substrate 301 and above the upper surface of the wiring layer 312 closest to the lower surface of the wiring substrate 301.

[Method for Manufacturing Test Board According to Third Embodiment]

Next, with reference to FIG. 21 to FIG. 29, the method for manufacturing the test board 300 according to the third embodiment is described. FIG. 21 to FIG. 29 are schematic cross-sectional views for describing the method for manufacturing the test board 300 according to the third embodiment. FIG. 21 to FIG. 29 illustrate a part corresponding to the cross-sectional surface illustrated in FIG. 20.

Figure 21:
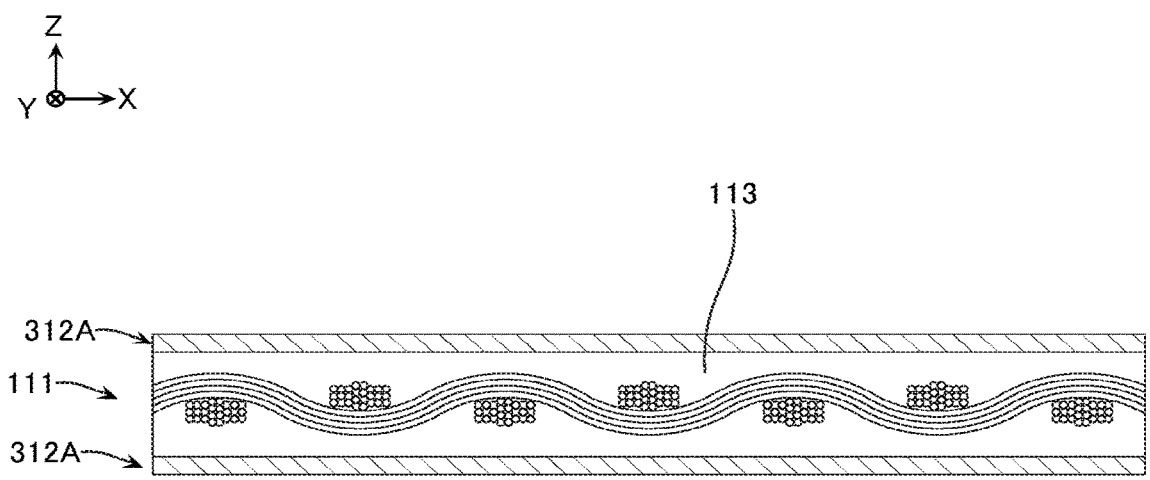
FIG. 21 is a schematic cross-sectional view for describing a method for manufacturing the test board.

In manufacturing the test board 300, for example, as illustrated in FIG. 21, one manufactured by impregnating the glass cloth 111 with the resin 113 is sandwiched between two metal foils 312A, and a pressurization process and a heat treatment are performed to harden the resin 113.

Figure 22:
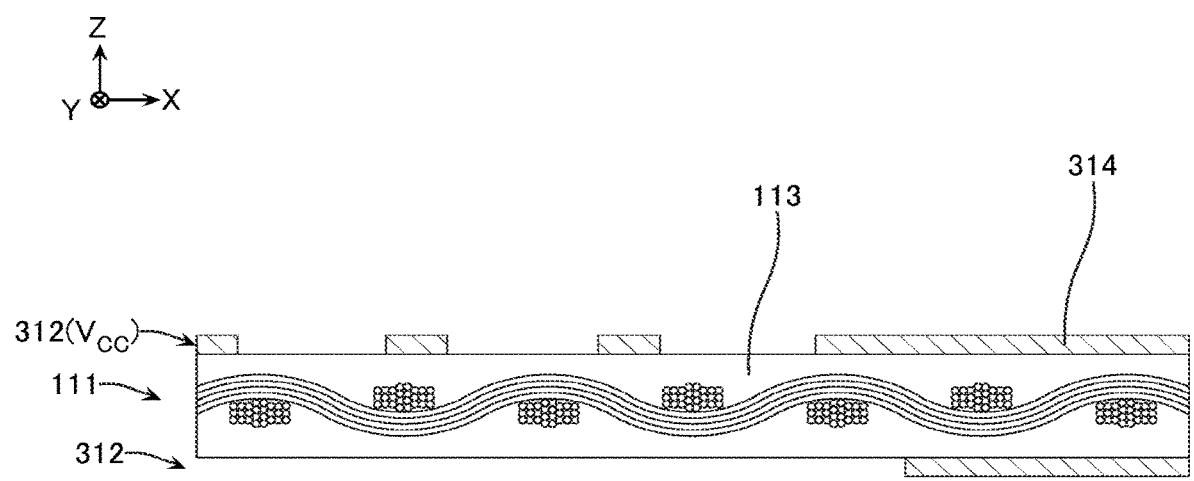
FIG. 22 is a schematic cross-sectional view for describing the manufacturing method.

Next, for example, as illustrated in FIG. 22, by means, such as photolithography and etching, a part of the metal foils 312A on the upper surface and the lower surface are removed to form wiring layers 312.

Figure 23:
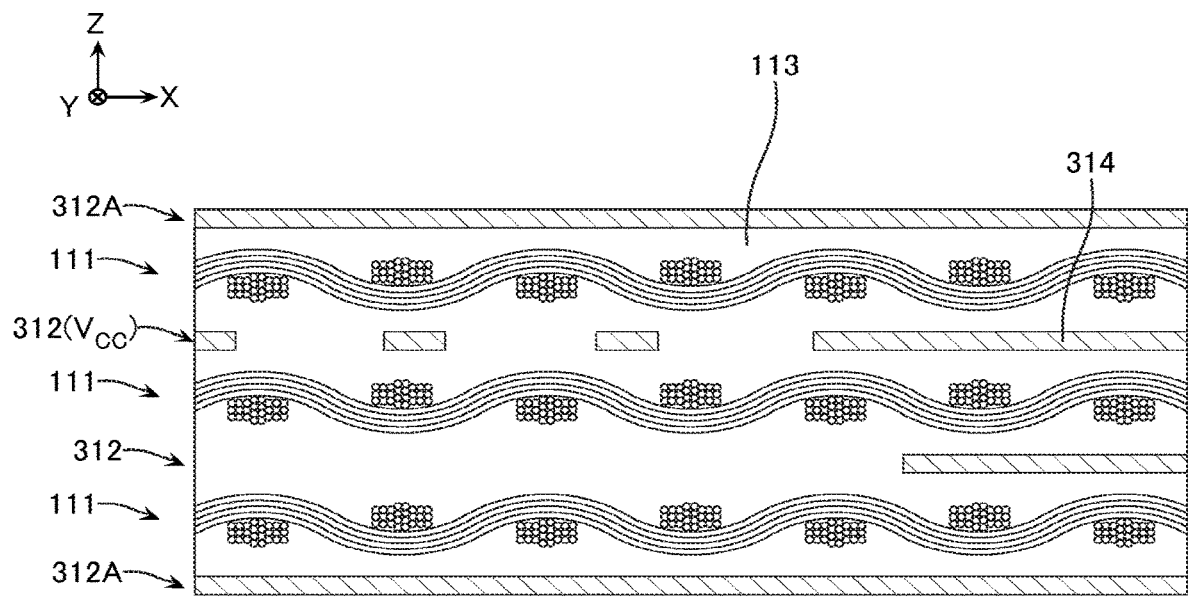
FIG. 23 is a schematic cross-sectional view for describing the manufacturing method.

Next, for example, as illustrated in FIG. 23, the structure illustrated in FIG. 22 is sandwiched between the glass clothes 111 impregnated with the resin 113 and the two metal foils 312A, and a pressurization process and a heat treatment are performed to harden the resin 113.

Figure 24:
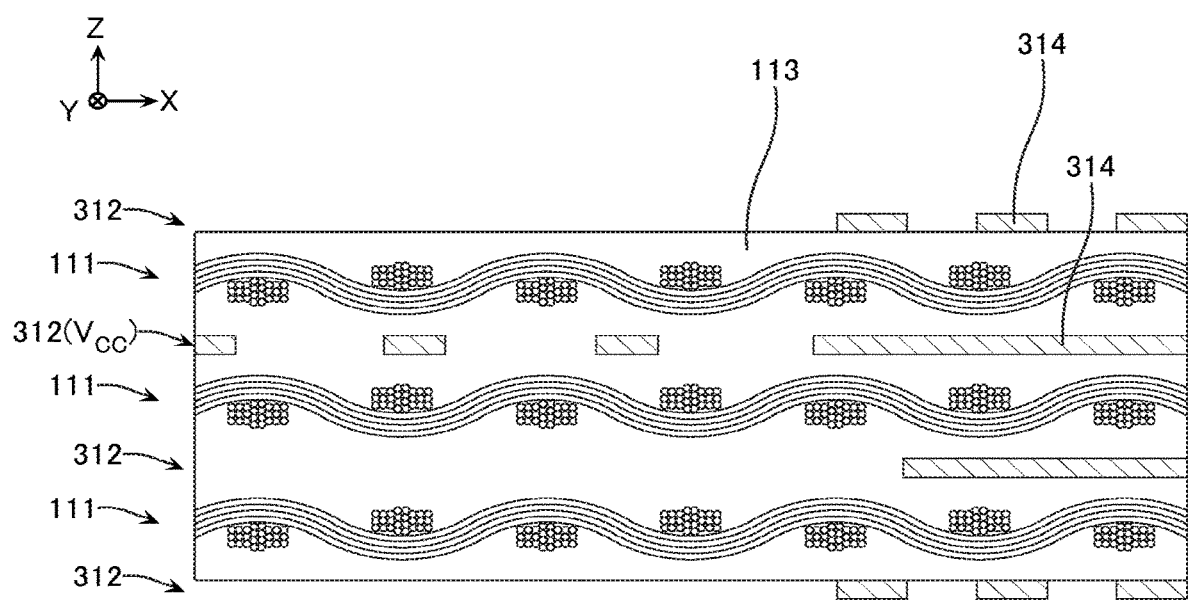
FIG. 24 is a schematic cross-sectional view for describing the manufacturing method.

Next, for example, as illustrated in FIG. 24, by means, such as photolithography and etching, a part of the metal foils 312A on the upper surface and the lower surface are removed to form wiring layers 312.

Figure 25:
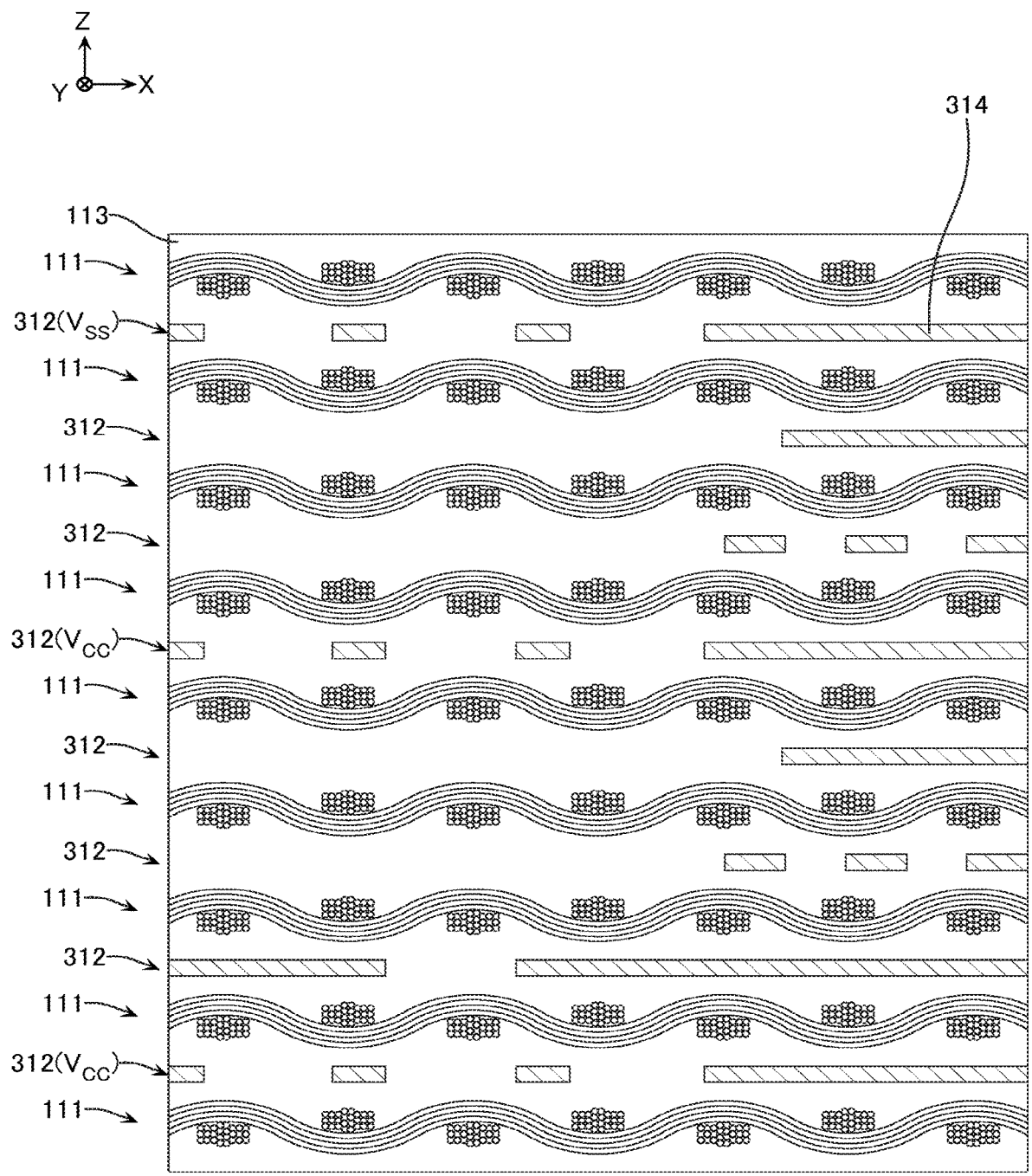
FIG. 25 is a schematic cross-sectional view for describing the manufacturing method.

Hereinafter, similarly, the processes described with reference to FIG. 23 and FIG. 24 are alternately performed multiple times to form the structure as illustrated in FIG. 25. In the last process of the plurality of processes corresponding to FIG. 23, the metal foil 312A may be omitted. Alternatively, in the last process of the plurality of processes corresponding to FIG. 24, all of the metal foils 312A on the upper surface and the lower surface may be removed.

Figure 26:
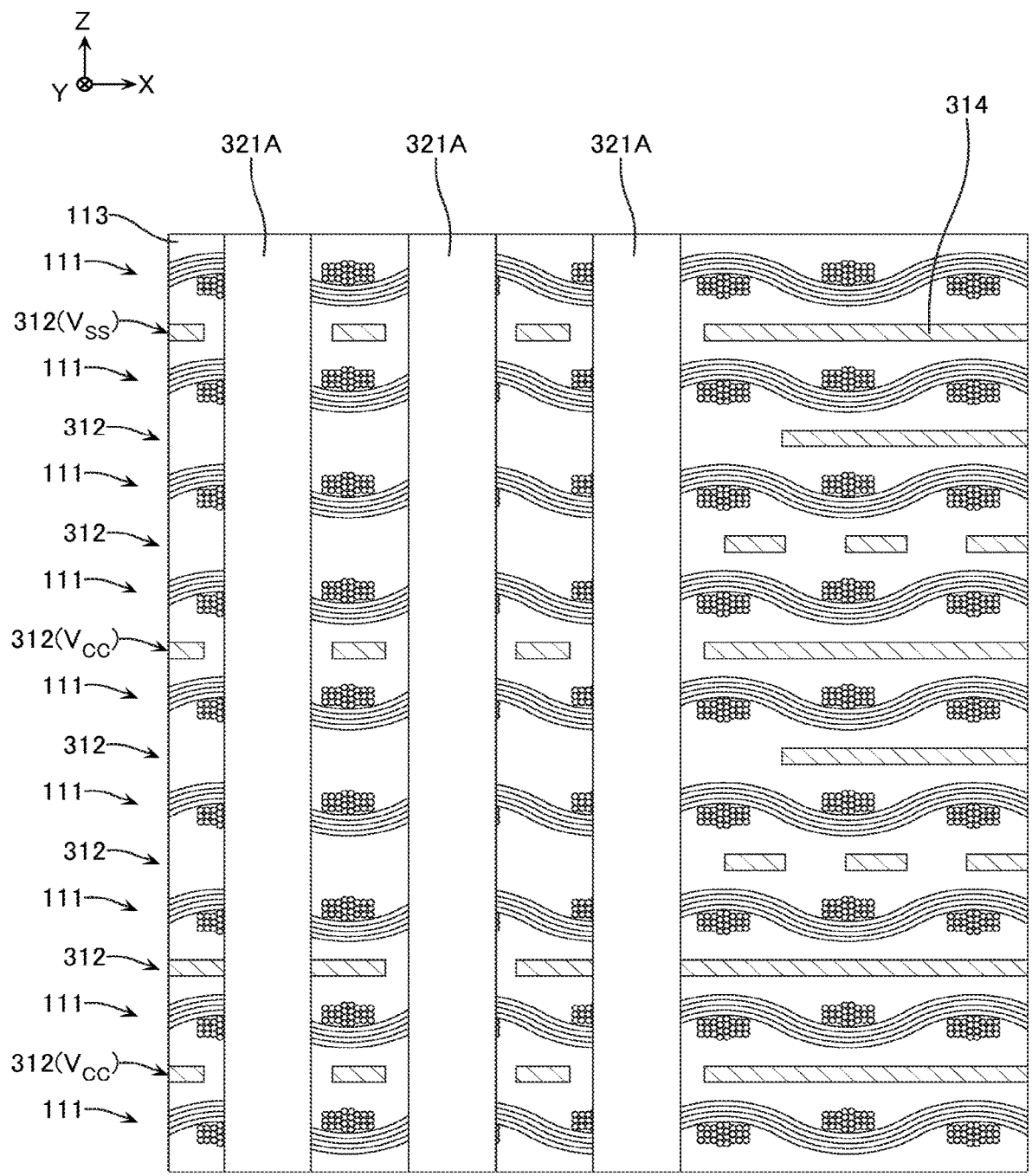
FIG. 26 is a schematic cross-sectional view for describing the manufacturing method.

Next, for example, as illustrated in FIG. 26, through-holes 321A are formed. The through-hole 321A extends in the Z-direction and passes through from the upper surface to the lower surface in the structure illustrated in FIG. 25. The through-hole 321A, for example, may be formed by a drilling process or the like. In the drilling process, a lubrification sheet may be attached to at least one of the upper surface and the lower surface of the structure illustrated in FIG. 25.

Figure 27:
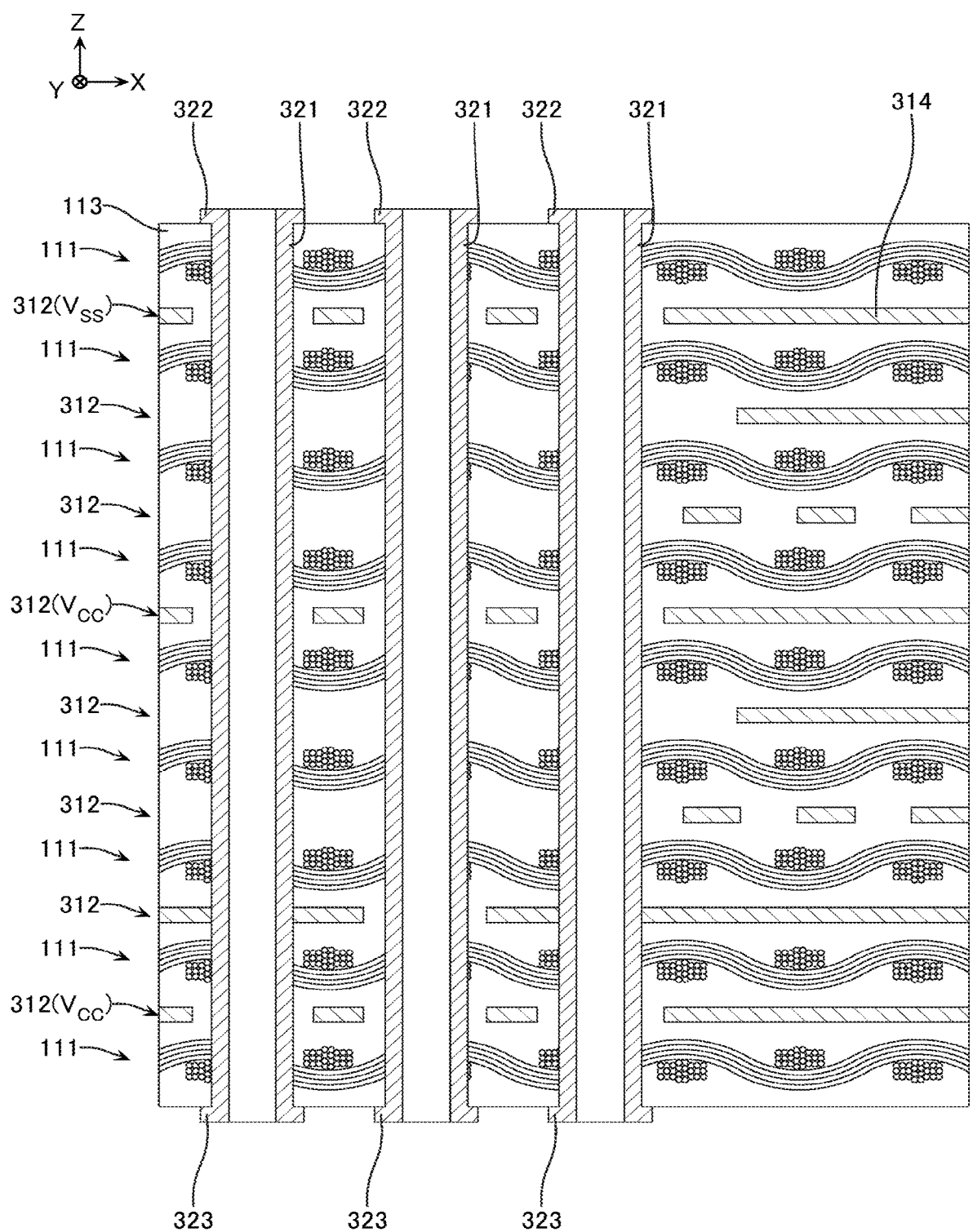
FIG. 27 is a schematic cross-sectional view for describing the manufacturing method.

Next, as illustrated in FIG. 27, through-members 321 are formed inside the through-holes 321A. This process, for example, may be performed by a plating process or the like.

Figure 28:
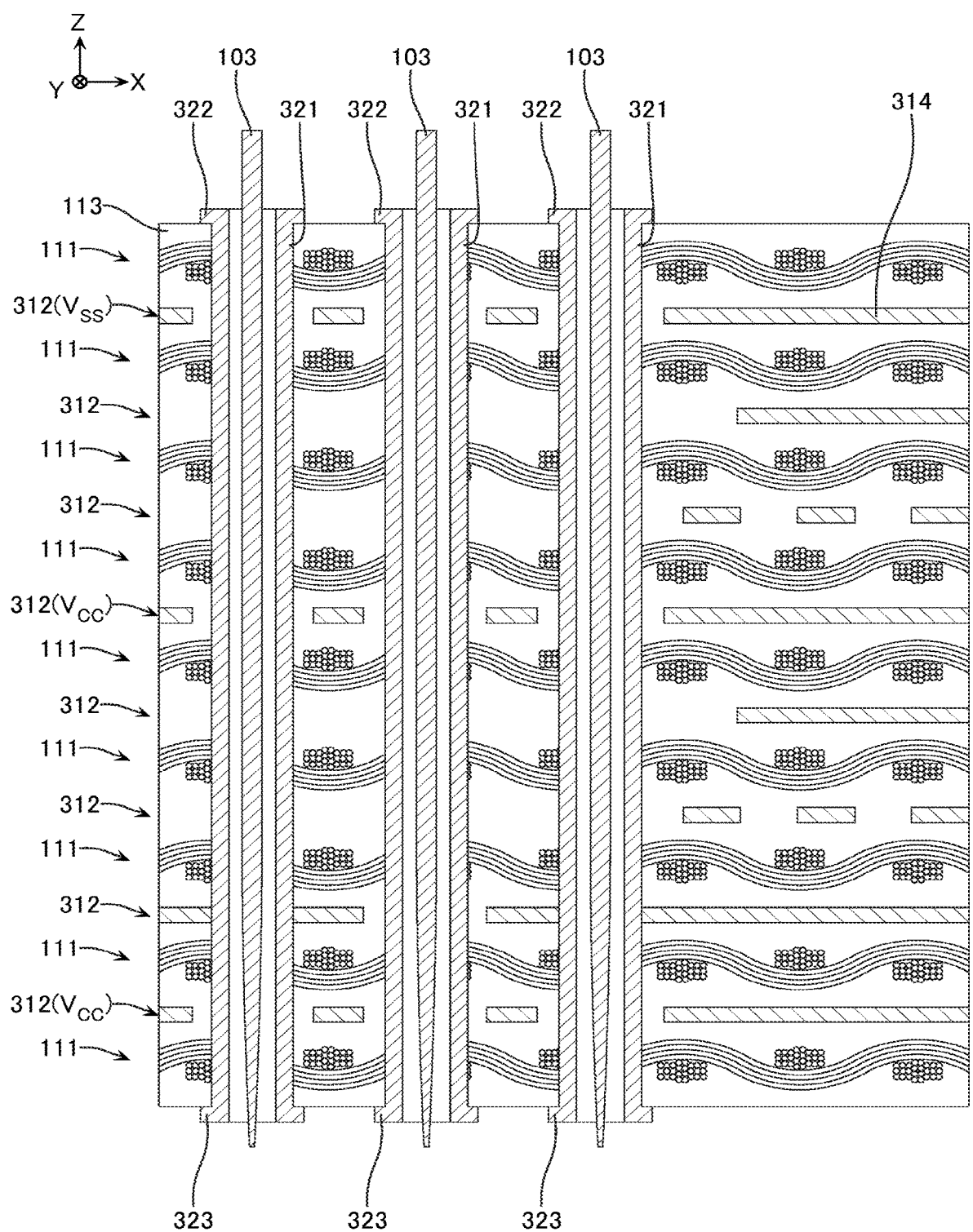
FIG. 28 is a schematic cross-sectional view for describing the manufacturing method.

Next, as illustrated in FIG. 28, the connector pins 103 are inserted into insides of the through-members 321.

Figure 29:
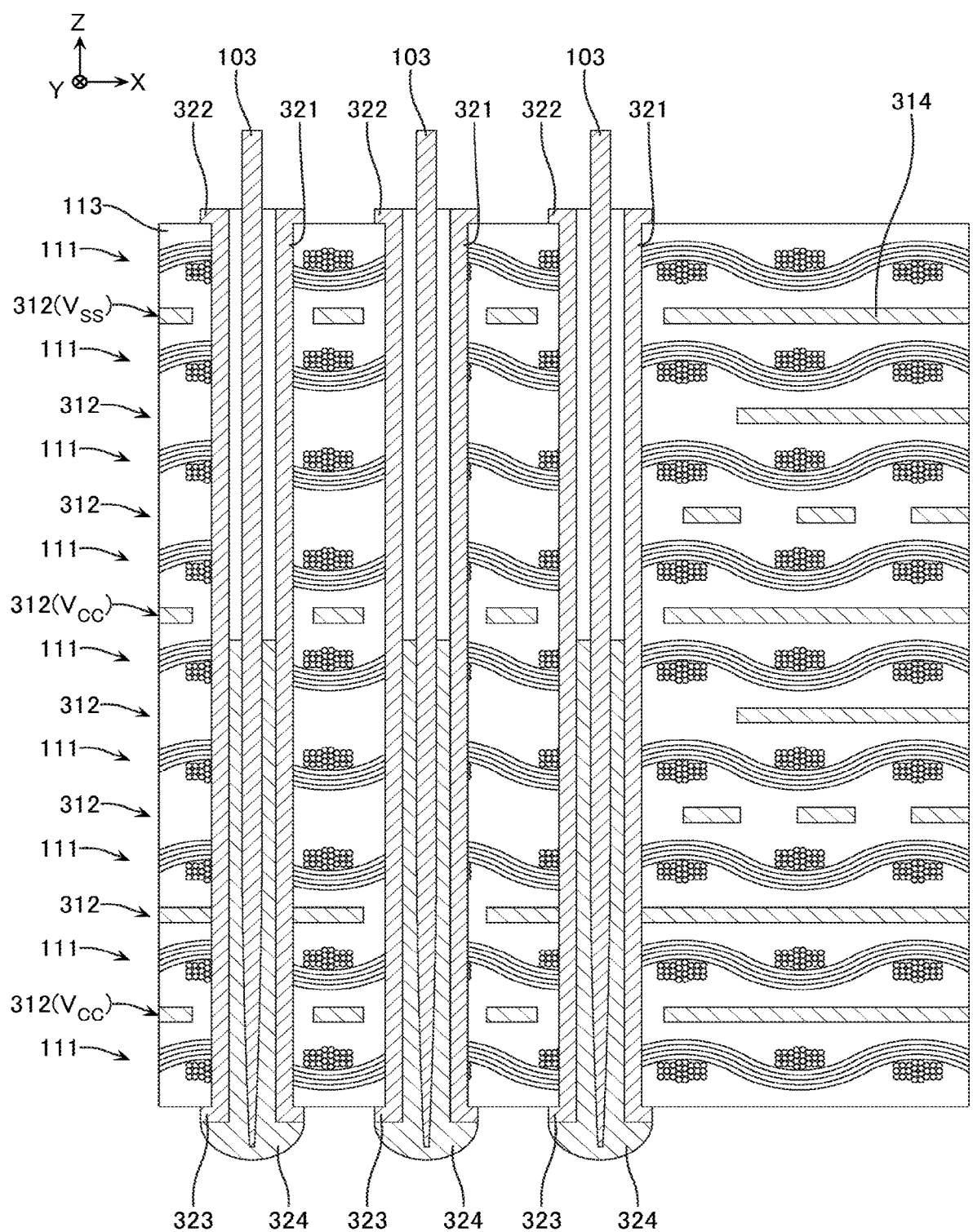
FIG. 29 is a schematic cross-sectional view for describing the manufacturing method.

Next, as illustrated in FIG. 29, the solders 324 are formed on the lower surfaces of the lands 323 and the insides of the through-members 321.

Afterwards, for example, as illustrated in FIG. 20, by forming the solder resists 131 and the waterproof coat 132, the wiring substrate 301 according to the third embodiment is formed. By soldering the sockets 102 (see FIG. 4), the jumper block 105 (see FIG. 4), and the like, the test board 300 according to the third embodiment is formed.

[Peeling of Glass Cloth 111 and Resin 113]

In creating the test board according to the second embodiment, as described with reference to FIG. 29, the solders 124 are formed. Here, when the solder 124 is formed only on the lower surface of the land 123, a mechanical strength of the wiring substrate weakens. On the other hand, when the solder 124 is filled up to an upper end of the through-member 121, the through-member 121 peels off from the resin 113 due to thermal shrinkage immediately after the soldering, and this results in peeling of the glass cloth 111 and the resin 113 in some cases.

Therefore, the inventors manufactured a structure in which the upper end portions of the solders 324 were positioned between the lower surfaces of the lands 322 and the upper surfaces of the lands 323. As a result, while a mechanical strength of the wiring substrate 301 fell within the allowable range, peeling of the through-member 321 from the resin 113 was able to be reduced. In view of this, the test board according to the third embodiment employs this structure.

[Semiconductor Memory Device 400 According to Fourth Embodiment]

The wiring substrates according to the first embodiment, the second embodiment, and the third embodiment have been exemplified above. However, the above-described configurations are merely examples, and a specific configuration is adjustable as necessary. For example, the wiring substrates according to the first embodiment, the second embodiment, and the third embodiment are applicable to a semiconductor device other than the test board.

Figure 30:
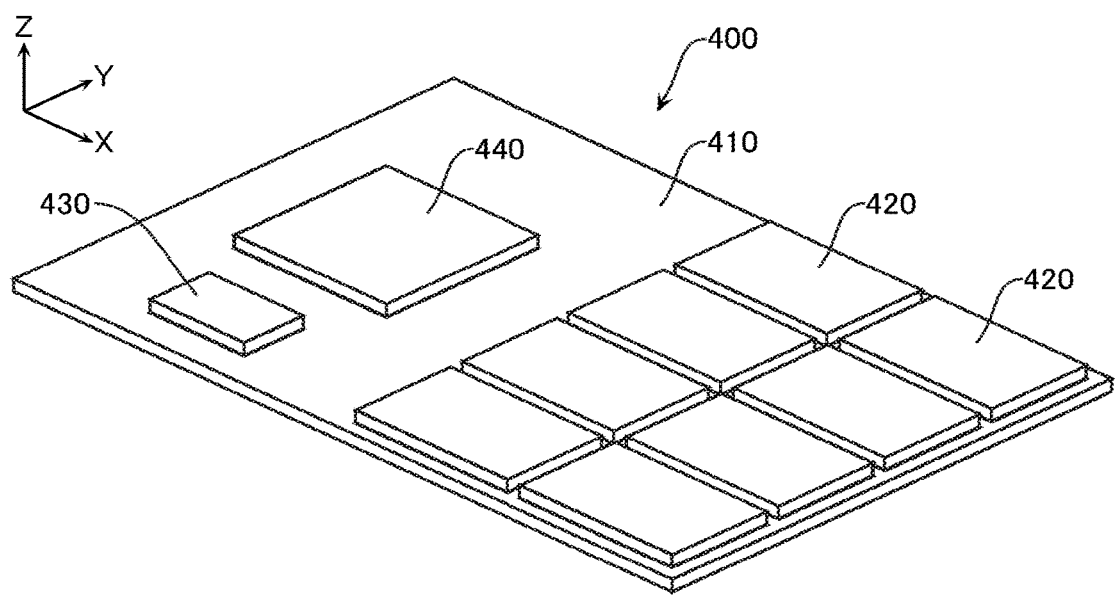
FIG. 30 is a schematic perspective view illustrating a configuration of a semiconductor memory device 400 according to a fourth embodiment.

FIG. 30 is a schematic perspective view illustrating a configuration of a semiconductor memory device 400 according to a fourth embodiment. The semiconductor memory device 400 may be, for example, a Solid State Drive (SSD). The semiconductor memory device 400 includes a wiring substrate 410, a plurality of NAND flash memories 420 mounted on the wiring substrate 410, a Dynamic Random Access Memory (DRAM) 430 mounted on the wiring substrate 410, and a controller 440 mounted on the wiring substrate 410.

The wiring substrate 410 is, for example, configured similarly to the wiring substrate according to the first embodiment, the second embodiment, or the third embodiment. The NAND flash memory 420, the DRAM 430, and the controller 440 are a package including an integrated circuit and are electrically connected to the wirings 114 in the wiring substrate 410 by any means including a pin or a BGA.

Remarks

The disclosure range of this specification includes the following embodiments.

Embodiment 1

A semiconductor device including:
a wiring substrate; and
a semiconductor chip mounted on the wiring substrate, wherein
the wiring substrate includes:
  a plurality of wiring layers and a plurality of insulating layers alternately stacked in a stacking direction; and
  a plurality of electrically conductive through-members extending in the stacking direction from one side to the other side in the stacking direction with respect to the plurality of wiring layers and the plurality of insulating layers, the plurality of electrically conductive through-members being arranged in a first direction intersecting with the stacking direction and a second direction intersecting with the stacking direction and the first direction,
the plurality of wiring layers include:
  a first wiring layer closest to a surface on one side in the stacking direction of the wiring substrate; and
  a second wiring layer second closest to the surface on the one side,
a distance from the surface on the one side to the first wiring layer in the stacking direction is larger than a distance from the first wiring layer to the second wiring layer in the stacking direction,
each of the plurality of through-members includes a land disposed on one end portion of the one side or the other side in the stacking direction, and
a distance between two lands adjacent in the first direction or the second direction is 0.2 mm or more.

Embodiment 2

The semiconductor device according to Embodiment 1, the wiring substrate further including
  a solder resist disposed on the one side in the stacking direction with respect to the plurality of wiring layers and the plurality of insulating layers, wherein
the solder resist has a glass-transition temperature higher than 110° C.

Embodiment 3

The semiconductor device according to Embodiment 2, further including
  a waterproof coat disposed on the one side in the stacking direction with respect to the solder resist, wherein
the waterproof coat has the surface on the one side in the stacking direction of the wiring substrate.

Embodiment 4

The semiconductor device according to Embodiment 1, wherein
the plurality of wiring layers further include:
  a third wiring layer closest to a surface on the other side in the stacking direction of the wiring substrate; and
  a fourth wiring layer second closest to the surface on the other side, and

a distance from the surface on the other side to the third wiring layer in the stacking direction is larger than a distance from the third wiring layer to the fourth wiring layer in the stacking direction.

Embodiment 5

The semiconductor device according to Embodiment 4, further including
- solder resists disposed on the one side and the other side in the stacking direction with respect to the plurality of wiring layers and the plurality of insulating layers in which
- the solder resist has a glass-transition temperature higher than 110° C.

Embodiment 6

The semiconductor device according to Embodiment 5, further including
- waterproof coats disposed on the one side and the other side in the stacking direction with respect to the plurality of wiring layers, the plurality of insulating layers, and the solder resists, wherein
- the waterproof coat disposed on the one side in the stacking direction with respect to the plurality of wiring layers, the plurality of insulating layers, and the solder resist has the surface on the one side in the stacking direction of the wiring substrate, and
- the waterproof coat disposed on the other side in the stacking direction with respect to the plurality of wiring layers, the plurality of insulating layers, and the solder resist has the surface on the other side in the stacking direction of the wiring substrate.

Embodiment 7

The semiconductor device according to Embodiment 1, wherein
- one of the plurality of wiring layers includes a first wiring,
- the first wiring includes a plurality of cavity portions,
- a part of the plurality of cavity portions includes any of the plurality of through-members, and
- the other part of the plurality of cavity portions includes none of the plurality of through-members when viewed from the stacking direction.

Embodiment 8

The semiconductor device according to Embodiment 1 wherein the semiconductor chip includes a NAND flash memory.

Others

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A wiring substrate comprising:
   a plurality of wiring layers and a plurality of insulating layers alternately stacked in a stacking direction, wherein
   the plurality of wiring layers include:
      a first wiring layer closest to a surface on one side in the stacking direction of the wiring substrate; and
      a second wiring layer second closest to the surface on the one side, and
   a distance from the surface on the one side to the first wiring layer in the stacking direction is larger than a distance from the first wiring layer to the second wiring layer in the stacking direction;
   a solder resist disposed on the one side in the stacking direction with respect to the plurality of wiring layers and the plurality of insulating layers; and
   an electrically conductive through-member extending in the stacking direction from the one side to the other side in the stacking direction with respect to the plurality of wiring layers, the plurality of insulating layers, and the solder resist, wherein
   the through-member includes a land disposed at an end portion on the one side in the stacking direction, and
   the land is spaced from the solder resist.

2. The wiring substrate according to claim 1, wherein
   the solder resist has a glass-transition temperature higher than 110° C.

3. The wiring substrate according to claim 2, further comprising
   a waterproof coat disposed on the one side in the stacking direction with respect to the solder resist, wherein
   the waterproof coat has the surface on the one side in the stacking direction of the wiring substrate.

4. The wiring substrate according to claim 1, wherein
   the plurality of wiring layers further include:
      a third wiring layer closest to a surface on the other side in the stacking direction of the wiring substrate; and
      a fourth wiring layer second closest to the surface on the other side, and
   a distance from the surface on the other side to the third wiring layer in the stacking direction is larger than a distance from the third wiring layer to the fourth wiring layer in the stacking direction.

5. The wiring substrate according to claim 4, further comprising
   solder resists disposed on the one side and the other side in the stacking direction with respect to the plurality of wiring layers and the plurality of insulating layers, wherein
   the solder resists have a glass-transition temperature higher than 110° C.

6. The wiring substrate according to claim 5, further comprising
   waterproof coats disposed on the one side and the other side in the stacking direction with respect to the plurality of wiring layers, the plurality of insulating layers, and the solder resists, wherein
   the waterproof coat disposed on the one side in the stacking direction with respect to the plurality of wiring layers, the plurality of insulating layers, and the solder resists has the surface on the one side in the stacking direction of the wiring substrate, and
   the waterproof coat disposed on the other side in the stacking direction with respect to the plurality of wiring layers, the plurality of insulating layers, and the solder resists has the surface on the other side in the stacking direction of the wiring substrate.

7. The wiring substrate according to claim 1, further comprising
a plurality of electrically conductive through-members extending in the stacking direction from the one side to the other side in the stacking direction with respect to the plurality of wiring layers and the plurality of insulating layers, the plurality of electrically conductive through-members being arranged in a first direction intersecting with the stacking direction and a second direction intersecting with the stacking direction and the first direction, wherein
each of the plurality of through-members includes a land disposed on one end portion of the one side or the other side in the stacking direction, and
a distance between two lands adjacent in the first direction or the second direction is 0.2 mm or more.

8. The wiring substrate according to claim 1, further comprising:
a connector pin disposed inside the through-member; and
a solder disposed at an end portion on the one side in the stacking direction of the through-member, the solder being electrically conductive with the through-member and the connector pin, wherein
an end portion on the other side in the stacking direction of the solder is disposed between the surface on the one side in the stacking direction of the wiring substrate and the surface on the other side in the stacking direction of the wiring substrate.

9. The wiring substrate according to claim 1, further comprising
a plurality of electrically conductive through-members extending in the stacking direction from the one side to the other side in the stacking direction with respect to the plurality of wiring layers and the plurality of insulating layers, the plurality of electrically conductive through-members being arranged in a first direction intersecting with the stacking direction and a second direction intersecting with the stacking direction and the first direction, wherein
one of the plurality of wiring layers includes a first wiring,
the first wiring includes a plurality of cavity portions,
a part of the plurality of cavity portions includes any of the plurality of through-members, and
the other part of the plurality of cavity portions includes none of the plurality of through-members when viewed from the stacking direction.

10. A wiring substrate comprising:
a plurality of wiring layers and a plurality of insulating layers alternately stacked in a stacking direction;
a plurality of electrically conductive through-members extending in the stacking direction from one side to the other side in the stacking direction with respect to the plurality of wiring layers and the plurality of insulating layers, the plurality of electrically conductive through-members being arranged in a first direction intersecting with the stacking direction and a second direction intersecting with the stacking direction and the first direction; and
a solder resist disposed on the one side in the stacking direction with respect to the plurality of wiring layers and the plurality of insulating layers, wherein
each of the plurality of through-members includes a land disposed on one end portion of the one side or the other side in the stacking direction,
a distance between two lands adjacent in the first direction or the second direction is 0.2 mm or more, and
a plurality of the lands corresponding to the plurality of through-members are spaced from the solder resist.

11. The wiring substrate according to claim 10, wherein the solder resist has a glass-transition temperature higher than 110° C.

12. The wiring substrate according to claim 10, further comprising:
a connector pin disposed inside of one of the plurality of through-members; and
a solder disposed at an end portion on the one side in the stacking direction of the one of the plurality of through-members, the solder being electrically conductive with the one of the plurality of through-members and the connector pin, wherein
an end portion on the other side in the stacking direction of the solder is disposed between the surface on the one side in the stacking direction of the wiring substrate and the surface on the other side in the stacking direction of the wiring substrate.

13. The wiring substrate according to claim 10, wherein one of the plurality of wiring layers includes a first wiring,
the first wiring includes a plurality of cavity portions,
a part of the plurality of cavity portions includes any of the plurality of through-members, and
the other part of the plurality of cavity portions includes none of the plurality of through-members when viewed from the stacking direction.

14. A wiring substrate comprising:
a plurality of wiring layers and a plurality of insulating layers alternately stacked in a stacking direction;
an electrically conductive through-member extending in the stacking direction from one side to the other side in the stacking direction with respect to the plurality of wiring layers and the plurality of insulating layers;
a connector pin disposed inside the through-member;
a solder disposed at an end portion on the one side in the stacking direction of the through-member, the solder being electrically conductive with the through-member and the connector pin; and
a solder resist disposed on the one side in the stacking direction with respect to the plurality of wiring layers and the plurality of insulating layers, wherein
an end portion on the other side in the stacking direction of the solder is disposed between a surface on the one side in the stacking direction of the wiring substrate and a surface on the other side in the stacking direction of the wiring substrate,
the through-member includes a land disposed at an end portion on the one side in the stacking direction, and
the land is spaced from the solder resist.

* * * * *